United States Patent
Hashimoto et al.

(10) Patent No.: US 9,691,606 B2
(45) Date of Patent: Jun. 27, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Yoshiro Hirose, Toyama (JP); Katsuyoshi Harada, Toyama (JP); Yoshinobu Nakamura, Toyama (JP); Ryota Sasajima, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/794,519

(22) Filed: Jul. 8, 2015

(65) Prior Publication Data

US 2016/0013042 A1    Jan. 14, 2016

(30) Foreign Application Priority Data

Jul. 9, 2014    (JP) .................................. 2014-141089

(51) Int. Cl.
*H01L 21/00*    (2006.01)
*H01L 21/02*    (2006.01)
(Continued)

(52) U.S. Cl.
CPC .......... *H01L 21/0228* (2013.01); *C23C 16/30* (2013.01); *C23C 16/4584* (2013.01);
(Continued)

(58) Field of Classification Search
CPC ........... H01L 21/0228; H01L 21/02211; H01L 21/02219; C23C 16/45531; C23C 16/45546; C23C 16/45578; C23C 16/4584
See application file for complete search history.

(56) References Cited

U.S. PATENT DOCUMENTS

2010/0136260 A1    6/2010    Matsunaga et al.
2011/0042686 A1*   2/2011    Han ........................ C30B 25/02
                                                          257/77
(Continued)

FOREIGN PATENT DOCUMENTS

| JP | 2010-090413 A | 4/2010 |
| JP | 2013-084911 A | 5/2013 |
| KR | 10-2011-0035935 A | 4/2011 |

OTHER PUBLICATIONS

Korean Office Action for Korean Patent Application No. 10-2015-0097220 dated Nov. 7, 2016 (with English translation).

*Primary Examiner* — Richard Booth
(74) *Attorney, Agent, or Firm* — Volpe and Koenig, P.C.

(57) ABSTRACT

There is provided a method of manufacturing a semiconductor device, including pre-treating a surface of an insulating film formed on a substrate by supplying a precursor containing a first element and a halogen element to the substrate; and forming a film containing the first element and a second element on the pre-treated surface of the insulating film by performing a cycle a predetermined number of times, the cycle including supplying the precursor to the substrate; and supplying a reactant containing the second element to the substrate, wherein the act of supplying the precursor and the act of supplying the reactant are performed non-simultaneously.

17 Claims, 12 Drawing Sheets

(51) Int. Cl.
*C23C 16/30* (2006.01)
*C23C 16/455* (2006.01)
*C23C 16/458* (2006.01)

(52) U.S. Cl.
CPC .. *C23C 16/45531* (2013.01); *C23C 16/45546* (2013.01); *C23C 16/45578* (2013.01)

(56) References Cited

U.S. PATENT DOCUMENTS

| | | |
|---|---|---|
| 2011/0076857 A1 | 3/2011 | Akae et al. |
| 2013/0078376 A1* | 3/2013 | Higashino ............... C23C 16/34 427/255.39 |
| 2013/0084712 A1 | 4/2013 | Yuasa et al. |

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-141089, filed on Jul. 9, 2014, the entire contents of which are incorporated herein by reference.

TECHNICAL FIELD

The present disclosure relates to a method of manufacturing a semiconductor device, a substrate processing apparatus, and a recording medium.

BACKGROUND

As one of the procedures for manufacturing a semiconductor device, there may be a procedure of forming a film, such as a nitride film or an oxide film, on a substrate by supplying a precursor containing, for example, silicon; or a reactant, such as a nitriding gas or an oxidizing gas, to the substrate.

However, in the case where an insulating film having insufficient precursor adsorption is used as a film forming base, an incubation period occurs immediately after a film forming procedure is started, which may result in forming a discontinuous film at an initial stage of the film forming procedure. In addition, when a reactant is supplied to the film forming base, a layer having a composition different from that of a film to be formed (hereinafter, referred to as a transition layer or a degradation layer) may be formed in an interface between the film forming base and the film to be formed.

SUMMARY

The present disclosure provides some embodiments of a technique capable of preventing occurrence of an incubation period and formation of a transition layer when a film forming procedure is performed on an insulating film.

According to an aspect of the present disclosure, there is provided a technique, including pre-treating a surface of an insulating film formed on a substrate by supplying a precursor containing a first element and a halogen element to the substrate; and forming a film containing the first element and a second element on the pre-treated surface of the insulating film by performing a cycle a predetermined number of times, the cycle including supplying the precursor to the substrate; and supplying a reactant containing the second element to the substrate, wherein the act of supplying the precursor and the act of supplying the reactant are performed non-simultaneously.

DETAILED DESCRIPTION

<One Embodiment of the Present Disclosure>

An embodiment of the present disclosure is described below in detail with reference to FIGS. 1 to 3.

(1) Configuration of Substrate Processing Apparatus

Figure 1:
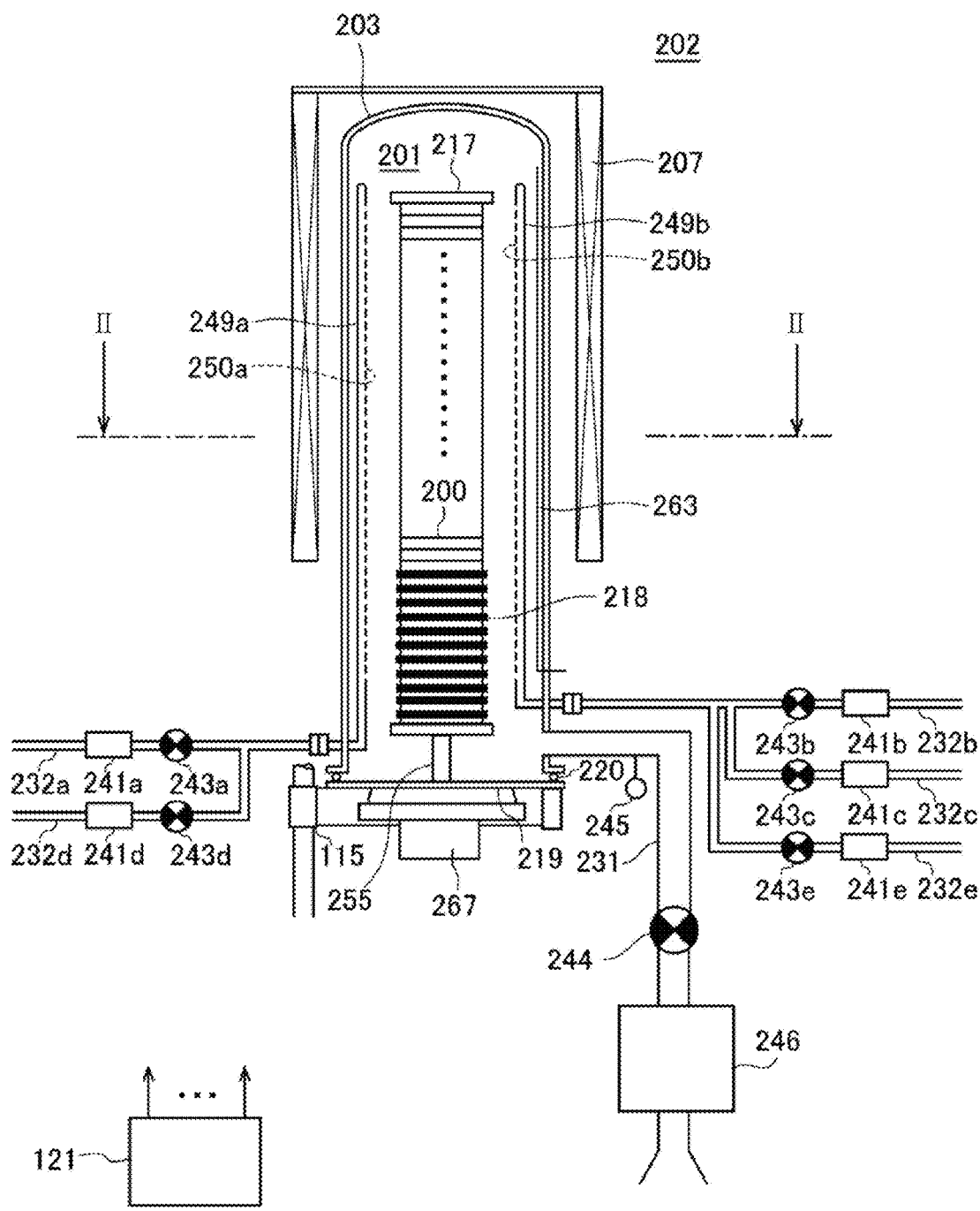
FIG. 1 is a schematic view illustrating a configuration of a vertical processing furnace of a substrate processing apparatus suitably used in an embodiment of the present disclosure, in which the processing furnace is shown in a longitudinal sectional view.
Figure 2:
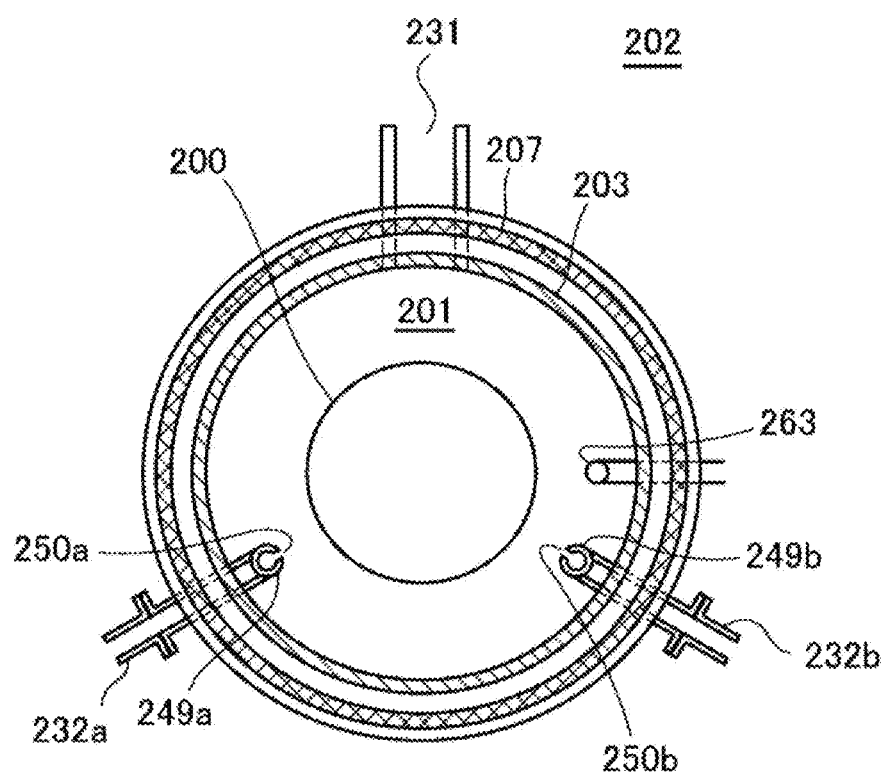
FIG. 2 is a schematic view illustrating a configuration of a portion of the vertical processing furnace in the substrate processing apparatus suitably used in the embodiment of the present disclosure, in which the portion of the processing furnace is shown in a sectional view taken along a line II-II in FIG. 1.

As shown in FIG. 1, a processing furnace 202 includes a heater 207 as a heating unit (or a heating mechanism). The heater 207 has a cylindrical shape, and is supported by a heater base (not shown) serving as a support plate and vertically arranged. The heater 207 also acts as an activating mechanism (or an exciting unit) to activate (or excite) gas by using heat, which will be described later.

A reaction tube 203 constituting a reaction vessel (or a process vessel) is installed inside the heater 207 to be concentric with the heater 207. The reaction tube 203 is made of a heat resistant material such as quartz ($SiO_2$) or silicon carbide (SiC) and has a cylindrical shape with its upper end closed and its lower end opened. A process chamber 201 is formed in a hollow cylindrical portion of the reaction tube 203. The process chamber 201 is configured to accommodate a plurality of wafers 200 as substrates in a state where the wafers 200 are horizontally positioned and vertically stacked in multiple stages in a boat 217, which will be described later.

Nozzles 249a and 249b are installed in the process chamber 201 to extend a lower portion of the reaction tube 203. The nozzles 249a and 249b are made of, for example, heat resistant material such as quartz or SiC. The nozzles 249a and 249b are connected with gas supply pipes 232a and 232b, respectively. The gas supply pipe 232b is connected with a gas supply pipe 232c. In this manner, the two nozzles 249a and 249b and the three gas supply pipes 232a to 232c are connected to the reaction tube 203, and thus, multiple kinds of gases can be supplied into the process chamber 201.

However, the processing furnace 202 of this embodiment is not limited to the above-mentioned configuration. For example, a metal manifold supporting the reaction tube 203 may be installed below the reaction tube 203 and the nozzles may be installed to extend through a side wall of the manifold. In this case, an exhaust pipe 231, which will be described later, may be further installed to be connected to the manifold. Further, the exhaust pipe 231 may be installed below the reaction tube 203, instead of the manifold. In this manner, a furnace opening portion of the processing furnace 202 may be made of metal and the nozzles and so on may be installed to be connected to the metal furnace opening portion.

MFCs (Mass Flow Controllers) 241a to 241c, which are flow rate controllers (or flow rate control parts), and valves 243a to 243c, which are opening/closing valves, are installed, respectively, in the gas supply pipes 232a to 232c in the above-mentioned order from upstream sides of the gas supply pipes 232a to 232c. Gas supply pipes 232d and 232e for supplying inert gas are connected to the gas supply pipes 232a and 232b, respectively, at downstream sides of the valves 243a and 243b. MFCs 241d and 241e, which are flow rate controllers (or flow rate control parts), and valves 243d and 243e, which are opening/closing valves, are installed, respectively, in the gas supply pipes 232d and 232e in the above-mentioned order from upstream sides of the gas supply pipes 232d and 232e.

The nozzles 249a and 249b are connected to leading end portions of the gas supply pipes 232a and 232b, respectively. As shown in FIG. 2, each of the nozzles 249a and 249b is installed in an annular space between an inner wall of the reaction tube 203 and the wafers 200. The nozzles 249a and 249b are vertically disposed along the inner wall of the reaction tube 203 to extend upward in the stacked direction of the wafers 200. Specifically, each of the nozzles 249a and 249b is installed along a wafer arrangement region, where the wafers 200 are arranged, and in a region that horizontally surrounds the wafer arrangement region at a side of the wafer arrangement region. Each of the nozzles 249a and 249b is formed of an L-shaped long nozzle, and its horizontal portion is installed to penetrate a lower sidewall of the reaction tube 203 while its vertical portion is installed to ascend at least from one end portion to the other portion of the wafer arrangement region. A plurality of gas supply holes 250a and 250b, through which gas is supplied, is formed on side surfaces of the nozzles 249a and 249b, respectively. The gas supply holes 250a and 250b are opened toward the center of the reaction tube 203 to allow the gas to be supplied toward the wafers 200. The plurality of gas supply holes 250a and 250b may have the same opening area and may be disposed over a space from a lower portion to an upper portion of the reaction tube 203 with the same opening pitch.

As described above, in this embodiment, the gas is transferred via the nozzles 249a and 249b, which are disposed in a vertically extending annular space, i.e., a cylindrical space formed between the inner wall of the reaction tube 203 and the edge portions of the stacked wafers 200. The gas is first ejected into the reaction tube 203 near the wafers 200 through each of the opened gas supply holes 250a and 250b of the nozzles 249a and 249b. Accordingly, the gas supplied into the reaction tube 203 mainly flows in a direction parallel to the surfaces of the wafers 200, i.e., in a horizontal direction. According to the above configurations, the gas can be uniformly supplied to the respective wafers 200, thereby improving uniformity of a thickness of a film formed on the surface of each of the wafers 200. The gas flowing on the surfaces of the wafers 200, i.e., residual gas after the reaction, flows toward an exhaust port, i.e., the exhaust pipe 231, which will be described later. However, a flow direction of the residual gas is not limited to a vertical direction, but may be suitably adjusted depending on a position of the exhaust port.

A precursor containing a predetermined element (e.g., first element) and a halogen element, for example, a halosilane precursor gas containing silicon (Si) as the predetermined element and a halogen element, is supplied from the gas supply pipe 232a into the process chamber 201 through the MFC 241a, the valve 243a, and the nozzle 249a.

The halosilane precursor gas may include a halosilane precursor in a gaseous state, for example, a gas obtained by vaporizing a halosilane precursor that is in a liquid state under normal temperature and pressure, a halosilane precursor that is in a gaseous state under normal temperature and pressure, or the like. The halosilane precursor may include a silane precursor having a halogen group. The halogen element includes at least one selected from a group consisting of chlorine (Cl), fluorine (F), bromine (Br), and iodine (I). As such, the halosilane precursor includes at least one halogen group selected from a group consisting of a chloro group, a fluoro group, a bromo group, and an iodine group. The halosilane precursor may refer to a kind of halide. As used herein, the term "precursor" may refer to "a precursor liquid in a liquid state," "a precursor gas in a gaseous state," or both.

For example, a precursor gas containing Si and Cl, i.e., a chlorosilane precursor gas may be used as the halosilane precursor gas. Dichlorosilane ($SiH_2Cl_2$, abbreviation: DCS) gas may be used as the chlorosilane precursor gas.

A reactant containing an element (e.g., at least one of second, third, or fourth element) different from the above-mentioned predetermined element, for example, a nitrogen (N)-containing gas, is supplied as a reaction gas from the gas supply pipe 232b into the process chamber 201 via the MFC 241b, the valve 243b, and the nozzle 249b. An example of the N-containing gas may include a hydrogen nitride-based gas. The hydrogen nitride-based gas may also refer to a material consisting of only two elements of N and H, and acts as a nitriding gas, i.e., a N source, in a substrate processing procedure, which will be described later. For example, ammonia ($NH_3$) gas may be used as the hydrogen nitride-based gas.

Another reactant containing an element (e.g., at least one of second, third, or fourth element) different from the above-mentioned predetermined element, for example, an oxygen (O)-containing gas, is also supplied as a reaction gas from the gas supply pipe 232b into the process chamber 201 via the MFC 241b, the valve 243b, and the nozzle 249b. The O-containing gas acts as an oxidizing gas, i.e., an O source, in the substrate processing procedure, which will be described later. For example, oxygen ($O_2$) gas may be used as the O-containing gas.

Still another reactant containing elements (e.g., at least one of second, third, or fourth element) different from the above-mentioned predetermined element, for example, a gas containing nitrogen (N) and carbon (C) is also supplied as a reaction gas from the gas supply pipe 232b into the process chamber 201 via the MFC 241b, the valve 243b, and the nozzle 249b. For example, an amine-based gas may be used as the gas containing N and C.

The amine-based gas may include amine in a gaseous state, for example, a gas obtained by vaporizing amine that is in a liquid state under normal temperature and pressure, a gas containing an amine group, such as amine, which is in a gaseous state under normal temperature and pressure, or the like. The amine-based gas may include amine such as ethylamine, methylamine, propylamine, isopropylamine, butylamine, isobutylamine, or the like. Amine is a generic term of compounds in which hydrogen (H) in ammonia ($NH_3$) is substituted with a hydrogen carbide group such as an alkyl group or the like. Amine includes a ligand containing C, i.e., an organic ligand, for example, a hydrogen carbide group such as an alkyl group or the like. The amine-based gas may be referred to as a non-Si containing gas since it contains no Si, and also as a non-Si-and-metal containing gas since it contains neither silicon nor metal. The amine-based gas may also be referred to as a material consisting of only three elements of C, N, and H and acts as a N source or a C source, in the substrate processing procedure, which will be described later. As used herein, the term "amine" may refer to "amine in a liquid state," "an amine-based gas in a gaseous state," or both.

An example of the amine-based gas may include triethylamine (($C_2H_5$)$_3$N, abbreviation: TEA) having a plurality of ligands (specifically, ethyl groups) including C in its chemical structural formula (e.g., in one molecule) and having more C than N in one molecule. Since amine such as TEA is in a liquid state under normal temperature and pressure, amine in the liquid state may be supplied as the amine-based gas (e.g., TEA gas) after being vaporized by a vaporizing system such as a vaporizer or a bubbler.

Still another reactant containing elements (e.g., at least one of second, third, or fourth element) different from the above-mentioned predetermined element, for example, a boron (B)-containing gas containing no borazine ring skeleton, is also supplied as a reaction gas from the gas supply pipe 232b into the process chamber 201 via the MFC 241b, the valve 243b, and the nozzle 249b. For example, a borane-based gas may be used as the boron (B)-containing gas containing no borazine ring skeleton.

The borane-based gas may include a borane compound in a gaseous state, for example, a gas obtained by vaporizing a borane compound that is in a liquid state under normal temperature and pressure, a borane compound that is in a gaseous state under normal temperature and pressure, or the like. The borane compound may include a haloborane compound containing B and a halogen element, for example, a chloroborane compound containing B and Cl. In addition, the borane compound may include borane (borohydride) such as monoborane ($BH_3$) or diborane ($B_2H_6$), or a borane compound (or borane derivative) in which H in borane is substituted with a different element. The borane-based gas acts as a B source in the substrate processing procedure, which will be described later. For example, trichloroborane ($BCl_3$) gas may be used as the borane-based gas. The $BCl_3$ gas is a B-containing gas which does not contain a borazine compound, which will be described later, i.e., a non-borazine-based B-containing gas.

Still another reactant containing elements (e.g., at least one of second, third, or fourth element) different from the above-mentioned predetermined element, for example, a gas containing a borazine ring skeleton, is also supplied as a reaction gas from the gas supply pipe 232b into the process chamber 201 via the MFC 241b, the valve 243b, and the nozzle 249b. For example, a gas containing a borazine ring skeleton and an organic ligand, i.e., an organic borazine-based gas, may be used as the gas containing a borazine ring skeleton.

An example of the organic borazine-based gas may include a gas obtained by vaporizing an alkylborazine compound which is an organic borazine compound. The organic borazine-based gas may also be referred to as a borazine compound gas or a borazine-based gas.

Figure 12A:
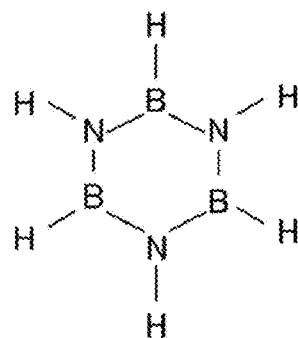
FIGS. 12A to 12D are views showing a chemical structural formula of borazine, a chemical structural formula of a borazine compound, a chemical structural formula of n,n',n"-trimethylborazine, and a chemical structural formula of n,n',n"-tri-n-propylborazine, respectively.
Figure 12B:
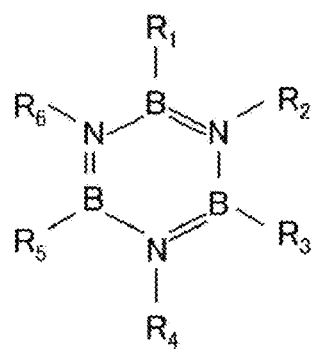

As used herein, borazine is a heterocyclic compound consisting of B, N, and H having a composition formula of $B_3H_6N_3$, and may be expressed by a chemical structural formula shown in FIG. 12A. The borazine compound has a borazine ring skeleton (abbreviated as a borazine skeleton) constituting a borazine ring consisting of three boron (B) atoms and three nitrogen (N) atoms. An organic borazine compound may be a borazine compound containing C or a borazine compound containing a ligand containing C, i.e., an organic ligand. An alkylborazine compound may be a borazine compound containing an alkyl group or a borazine compound containing alkyl group as a ligand. The alkylborazine compound is a compound in which at least one of six hydrogen (H) atoms contained in borazine is substituted with hydrocarbon including one or more carbon (C) atoms, and may be expressed by a chemical structural formula shown in FIG. 12B. Each of $R_1$ to $R_6$ in the chemical structural formula shown in FIG. 12B is H or an alkyl group including one to four carbon (C) atoms. $R_1$ to $R_6$ may be the same alkyl group or different alkyl groups except for the case where all of $R_1$ to $R_6$ are H. The alkylborazine compound may also be referred to as a material which has a borazine ring skeleton constituting a borazine ring and contains B, N, H, and C. In addition, the alkylborazine compound may be referred to as a material which has a borazine ring skeleton and contains an alkyl ligand. $R_1$ to $R_6$ may be H or an alkenyl or alkynyl group including one to four carbon (C) atoms. $R_1$ to $R_6$ may be the same alkenyl or alkynyl group or different alkenyl or alkynyl groups except for the case where all of $R_1$ to $R_6$ are H.

The borazine-based gas acts as either a B source, an N source or, a C source, in the substrate processing procedure, which will be described later.

Figure 12C:
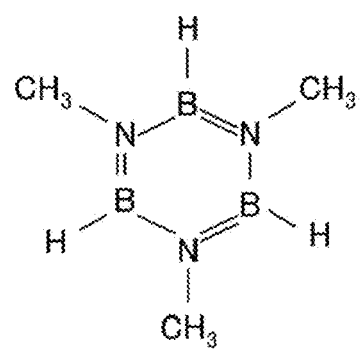
Figure 12D:
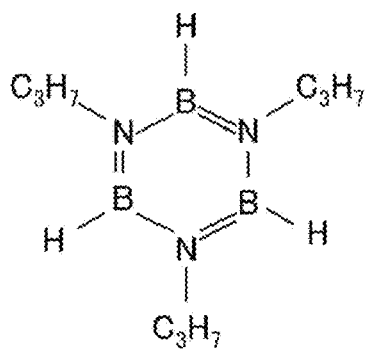

Examples of the borazine-based gas may include n,n',n''-trimethylborazine (TMB) gas, n,n',n''-triethylborazine (TEB) gas, n,n',n''-tri-n-propylborazine (TPB) gas, n,n',n''-triisopropylborazine (TIPB) gas, n,n',n''-tri-n-butylborazine (TBB) gas, n,n',n''-triisobutylborazine (TIBB) gas and the like. TMB is a borazine compound in which each of $R_1$, $R_3$, and $R_5$ in the chemical structural formula shown in FIG. 12B is H and each of $R_2$, $R_4$ and $R_6$ is a methyl group, and may be expressed by a chemical structural formula shown in FIG. 12C. TEB is a borazine compound in which each of $R_1$, $R_3$, and $R_5$ in the chemical structural formula shown in FIG. 12B is H and each of $R_2$, $R_4$, and $R_6$ is an ethyl group. TPB is a borazine compound in which each of $R_1$, $R_3$, and $R_5$ in the chemical structural formula shown in FIG. 12B is H and each of $R_2$, $R_4$, and $R_6$ is a propyl group, and may be expressed by a chemical structural formula shown in FIG. 12D. TIPB is a borazine compound in which each of $R_1$, $R_3$, and $R_5$ in the chemical structural formula shown in FIG. 12B is H and each of $R_2$, $R_4$, and $R_6$ is an isopropyl group. TIBB is a borazine compound in which each of $R_1$, $R_3$, and $R_5$ in the chemical structural formula shown in FIG. 12B is H and each of $R_2$, $R_4$, and $R_6$ is an isobutyl group.

Since a borazine compound such as TMB is in a liquid state under normal temperature and pressure, the borazine compound in the liquid state may be supplied as a borazine-based gas (e.g., TMB gas) after being vaporized by a vaporizing system such as a vaporizer or a bubbler.

Still another reactant containing an element (e.g., at least one of second, third, or fourth element) different from the above-mentioned predetermined element, for example, a carbon (C)-containing gas, is supplied as a reaction gas from the gas supply pipe 232c into the process chamber 201 via the MFC 241c, the valve 243c, the gas supply pipe 232b, and the nozzle 249b. An example of the C-containing gas may include a hydrogen carbide-based gas. The hydrogen carbide-based gas may also refer to a material consisting of only two elements of C and H, and acts as a C source in the substrate processing procedure, which will be described later. For example, a propylene ($C_3H_6$) gas may be used as the hydrogen carbide-based gas.

An inert gas such as nitrogen ($N_2$) gas is supplied from the gas supply pipes 232d and 232e into the process chamber 201 via the MFCs 241d and 241e, the valves 243d and 243e, the gas supply pipes 232a and 232b, and the nozzle 249a and 249b, respectively. The inert gas supplied from the gas supply pipes 232d and 232e acts as a purge gas, a dilution gas, or a carrier gas in the substrate processing procedure, which will be described later.

A precursor supply system is mainly includes the gas supply pipe 232a, the MFC 241a, and the valve 243a. The precursor supply system may also include the nozzle 249a. The precursor supply system may also be referred to as a precursor gas supply system. When the halosilane precursor flows from the gas supply pipe 232a, the precursor supply system may also be referred to as a halosilane precursor supply system or a halosilane precursor gas supply system.

When the N-containing gas is supplied from the gas supply pipe 232b, an N-containing gas supply system mainly includes the gas supply pipe 232b, the MFC 241b, and the valve 243b. The N-containing gas supply system may also include the nozzle 249b. The N-containing gas supply system may also be referred to as a nitriding gas supply system or a nitriding agent supply system. When the hydrogen nitride-based gas is supplied from the gas supply pipe 232b, the N-containing gas supply system may also be referred to as a hydrogen nitride-based gas supply system or a hydrogen nitride supply system.

When the O-containing gas is supplied from the gas supply pipe 232b, an O-containing gas supply system mainly includes the gas supply pipe 232b, the MFC 241b, and the valve 243b. The O-containing gas supply system may also include the nozzle 249b. The O-containing gas supply system may also be referred to as an oxidizing gas supply system or an oxidizing agent supply system.

When the gas from containing N and C is supplied from the gas supply pipe 232b, a N-and-C-containing gas supply system mainly includes the gas supply pipe 232b, the MFC 241b, and the valve 243b. The N-and-C-containing gas supply system may also include the nozzle 249b. When the amine-based gas is supplied from the gas supply pipe 232b, the N-and-C-containing gas supply system may also be referred to as an amine-based gas supply system or an amine supply system. Since the gas containing N and C is a N-containing gas and a C-containing gas, the N-and-C-containing gas supply system may be included in the N-containing gas supply system or a C-containing gas supply system that will be described later.

When the B-containing gas is supplied from the gas supply pipe 232b, a B-containing gas supply system mainly includes the gas supply pipe 232b, the MFC 241b, and the valve 243b. The B-containing gas supply system may also include the nozzle 249b. When the borane-based gas flows from the gas supply pipe 232b, the B-containing gas supply system may also be referred to as a borane-based gas supply system or a borane compound supply system. When the borazine-based gas flows from the gas supply pipe 232b, the B-containing gas supply system may also be referred to as a borazine-based gas supply system, an organic borazine-based gas supply system, or a borazine compound supply system. Since the borazine-based gas is a gas containing N and C, a N-containing gas, and a C-containing gas, the borazine-based gas supply system may be included in the N-and-C-containing gas supply system, the N-containing gas supply system, or the C-containing gas supply system.

In addition, the C-containing gas supply system mainly includes the gas supply pipe 232c, the MFC 241c, and the valve 243c. The C-containing gas supply system may include a portion of the nozzle 249b positioned at a downstream side of a position where the gas supply pipe 232b is connected with the gas supply pipe 232c. When the hydrogen carbide-based gas is supplied from the gas supply pipe 232b, the C-containing gas supply system may also be referred to as a hydrogen carbide-based gas supply system or a hydrogen carbide supply system.

One or all of the above-mentioned N-containing gas supply system, O-containing gas supply system, N-and-C-containing gas supply system, B-containing gas supply system, and C-containing gas supply system may also be referred to as a reaction gas supply system or a reactant supply system.

An inert gas supply system mainly includes the gas supply pipes 232d and 232e, the MFCs 241d and 241e, and the valves 243d and 243e. The inert gas supply system may also be referred to as a purge gas supply system, a dilution gas supply system, or a carrier gas supply system.

The exhaust pipe 231 for exhausting an internal atmosphere of the process chamber 201 is installed to be connected to the reaction tube 203. A pressure sensor 245, which is a pressure detector (or a pressure detecting part) for detecting an internal pressure of the process chamber 201, an APC (Auto Pressure Controller) valve 244, which is a pressure regulator (or a pressure adjusting part), and a vacuum pump 246 as a vacuum exhaust device are connected to the exhaust pipe 231. The APC valve 244 is configured to start and stop vacuum-exhausting the process chamber 201 by opening and closing a valve in a state where the vacuum pump 246 is in operation, and further to adjust the internal pressure of the process chamber 201 by adjusting a degree of valve opening based on pressure information detected by the pressure sensor 245 in a state where the vacuum pump 246 is in operation. An exhaust system mainly includes the exhaust pipe 231, the APC valve 244, and the pressure sensor 245. The exhaust system may also include the vacuum pump 246.

A seal cap 219 as a lid member of a furnace opening configured to hermetically seal a lower end opening of the reaction tube 203 is installed under the reaction tube 203. The seal cap 219 is configured to contact the lower end of the reaction tube 203 from the lower side of the reaction tube 203 in a vertical direction. The seal cap 219 is made of, for example, metal such as stainless steel (SUS) and has a disc shape. An O-ring 220, which is a seal member in contact with the lower end portion of the reaction tube 203, is installed at an upper surface of the seal cap 219. A rotary mechanism 267 configured to rotate the boat 217, which will be described later, is installed at a side of the seal cap 219 opposite to the process chamber 201. A rotary shaft 255 of the rotary mechanism 267 extends through the seal cap 219 and is connected to the boat 217. The rotary mechanism 267 is configured to rotate the wafers 200 by rotating the boat 217. The seal cap 219 is configured to be vertically moved by a boat elevator 115, which is an elevation mechanism arranged vertically outside the reaction tube 203. The boat elevator 115 is configured to load and unload the boat 217 into and out of the process chamber 201 by elevating and lowering the seal cap 219. As such, the boat elevator 115 is configured as a transfer device (or a transfer mechanism) that transfers the boat 217 and the wafers 200 supported by the boat 217 into and out of the process chamber 201.

The boat 217, which is used as a substrate support, is configured to support a plurality of wafers 200, e.g., 25 to 200 sheets, in a state where the wafers 200 are horizontally positioned and vertically stacked in multiple stages, i.e., separated from each other, and the centers of the wafers 200 are aligned with each other. The boat 217 is made of, for example, heat resistant material such as quartz or silicon carbide (SiC). Heat insulating plates 218 made of, for example, heat resistant material such as quartz or silicon carbide (SiC) are stacked in multiple stages, in a horizontal posture, at a lower portion of the boat 217. With the above configuration, transfer of heat from the heater 207 to the seal cap 219 is hindered. However, this embodiment is not limited as described above. Instead of installing the heat insulating plates 218 to the lower portion of the boat 217, a heat insulating tube formed of a tubular member made of heat resistant material such as quartz or SiC may be installed.

A temperature sensor 263, which is a temperature detector, is installed in the reaction tube 203. A condition of applying current to the heater 207 is adjusted based on temperature information detected by the temperature sensor 263, so that the interior of the process chamber 201 has a desired temperature distribution. The temperature sensor 263 has an L-shaped configuration, like the nozzles 249a and 249b, and is installed along the inner wall of the reaction tube 203.

Figure 3:
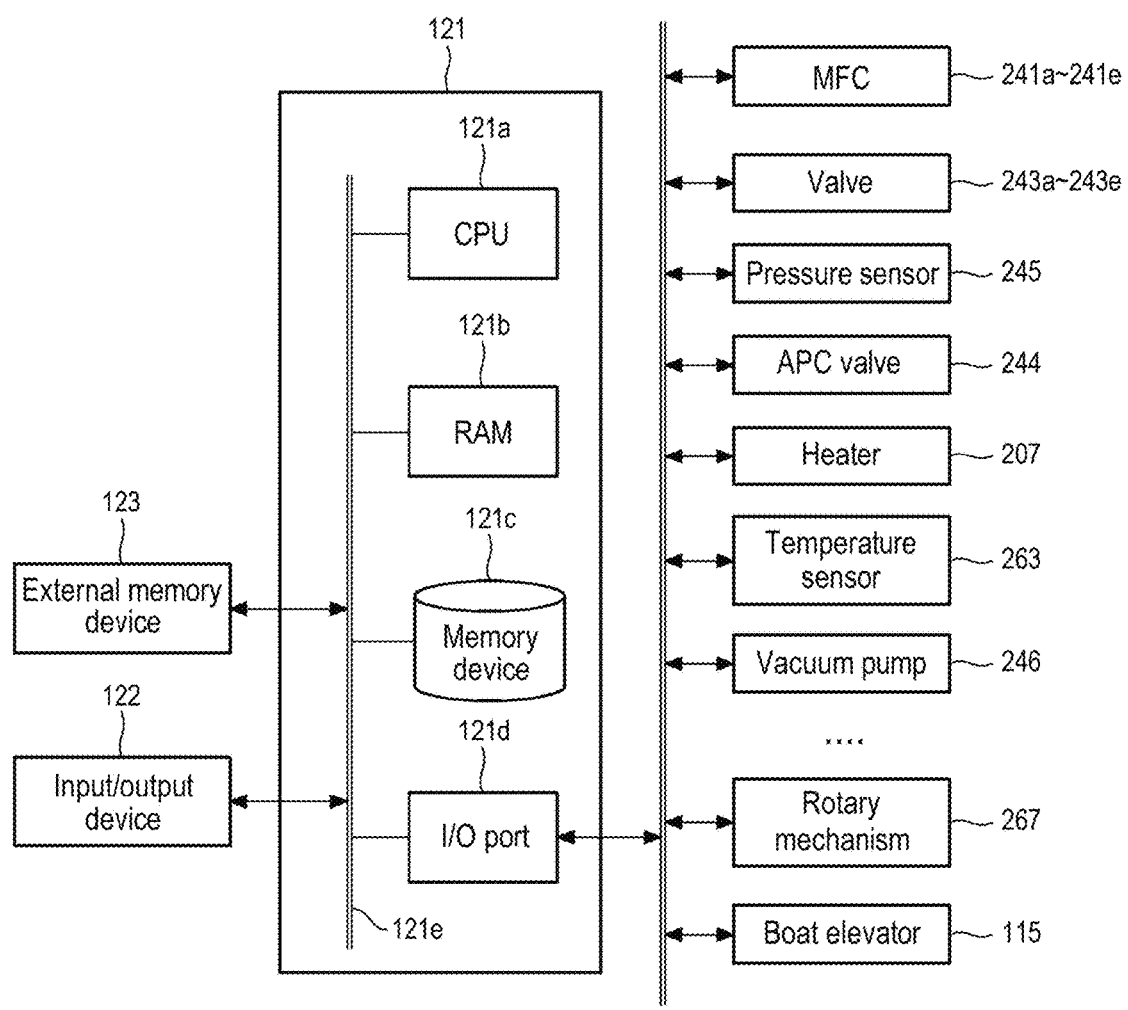
FIG. 3 is a schematic view illustrating a configuration of a controller in the substrate processing apparatus suitably used in the embodiment of the present disclosure, in which a control system of the controller is shown in a block diagram.

As illustrated in FIG. 3, a controller 121 serving as a control unit (or a control part) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like, is connected to the controller 121.

The memory device 121c is configured with, for example, a flash memory, an HDD (Hard Disk Drive), or the like. A control program for controlling operations of the substrate processing apparatus and a processing recipe in which a sequence or a condition for a substrate process to be described later is written are readably stored in the memory device 121c. The processing recipe, which is a combination of sequences, causes the controller 121 to execute each sequence in a procedure of the substrate process, which will be described later, in order to obtain a predetermined result, and functions as a program. Hereinafter, the processing recipe and the control program may be collectively referred to as a program. As used herein, the term "program" may include the case in which only one of the processing recipe and the control program is included, or the case in which any combination of the processing recipe and the control program is included. The RAM 121b is configured as a memory area (or a work area) in which a program or data read by the CPU 121a is temporarily stored.

The I/O port 121d is connected to the above-described MFCs 241a to 241e, the valves 243a to 243e, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. According to an input of an operation command from the input/output device 122, the CPU 121a reads the processing recipe from the memory device 121c. The CPU 121a is configured to control flow rate controlling operation of various types of gases by the MFCs 241a to 241e, opening and closing operation of the valves 243a to 243e, opening and closing operation of the APC valve 244, pressure adjusting operation by the APC valve 244 based on the pressure sensor 245, start and stop operation of the vacuum pump 246, temperature adjusting operation of the heater 207 based on the temperature sensor 263, rotation and rotation speed adjusting operation by the rotary mechanism 267 for the boat 217, elevation operation by the boat elevator 115 for the boat 217, and the like according to contents of the read processing recipe.

The controller 121 is not limited to being configured as a dedicated computer but may be configured as a general-purpose computer. For example, the controller 121 of this embodiment may be configured by preparing an external memory device 123 (for example, a magnetic tape, a magnetic disc such as a flexible disc or a hard disk, an optical disc such as a CD or DVD, a magneto-optical disc such as an MO, a semiconductor memory such as a USB memory or a memory card), in which the program is stored, and installing the program on the general-purpose computer using the external memory device 123. Means for supplying a program to a computer is not limited to the case in which the program is supplied via the external memory device 123. For example, the program may be supplied using a communication means such as the Internet or a dedicated line, rather than through the external memory device 123. The memory device 121c or the external memory device 123 is configured as a non-transitory computer-readable recording medium. Hereinafter, the means for supplying the program will be simply referred to as "a recording medium." As used herein, the term "recording medium" may include only the memory device 121c, only the external memory device 123, or both of the memory device 121c and the external memory device 123.

(2) Substrate Process

Next, an example of a sequence for forming a film containing a plurality of species of elements on a substrate having an insulating film formed thereon, which is one of the procedures for manufacturing a semiconductor device using the above-described substrate processing apparatus, will be described with reference to FIG. 4. In the following descriptions, operations of various parts constituting the substrate processing apparatus are controlled by the controller 121.

Figure 4:
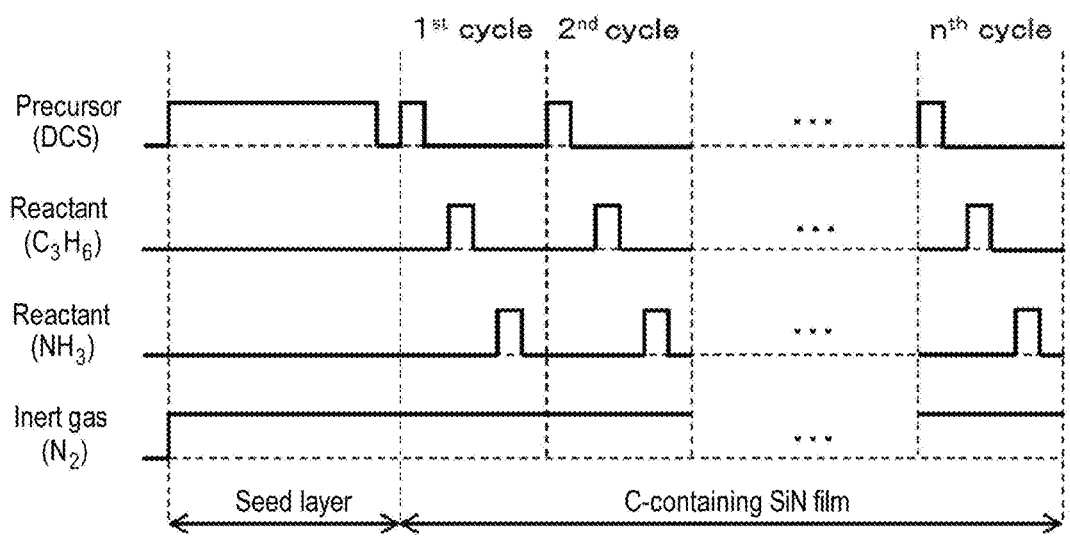
FIG. 4 is a view illustrating gas supply timings in a film forming sequence according to one embodiment of the present disclosure.

In the film forming sequence shown in FIG. 4, a surface of a silicon oxide film (SiO film) formed, as an insulating film, on a+surface of the wafer 200 is first pre-treated by supplying a DCS gas as a precursor to the wafer 200. Next, a silicon nitride film (SiN film) containing C is formed, as a film containing Si, C, and N, on the pre-treated surface of the SiO film by performing a cycle a predetermined number of times (one or more times), the cycle including supplying the DCS gas to the wafer 200; supplying $C_3H_6$ gas, as a reactant, to the wafer 200; and supplying $NH_3$ gas, as a reactant, to the wafer 200, in which the acts of supplying the DCS gas, supplying the $C_3H_6$ gas, and supplying the $NH_3$ gas are performed non-simultaneously, i.e., asynchronously. The SiN film containing C is also referred to as a C-added (or doped) SiN film, a C-doped SiN film, a C-containing SiN film or, simply, a SiN film.

In the present disclosure, the film forming sequence may be sometimes expressed as follows:

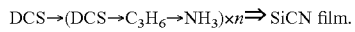

DCS→(DCS→$C_3H_6$→$NH_3$)×$n$ ⇒ SiCN film.

In the present disclosure, the term "a wafer" may be used for referring to not only a wafer per se but also a laminated body (or aggregate) of a wafer and certain layers or films formed on a surface of the wafer (that is, a wafer including certain layers or films formed on a surface of the wafer is sometimes referred to as a "wafer"). In the present disclosure, the term "a surface of a wafer" may mean a surface (or exposed surface) of a wafer per se, or a surface of a specified layer or film formed on the wafer, namely an outermost surface of the wafer as a laminated body.

In the present disclosure, the expression "supplying a specified gas to a wafer" may mean that the specified gas is directly supplied to a surface (or exposed surface) of a wafer per se, or that the specified gas is supplied to a surface of a certain layer or film formed on the wafer, namely to an outermost surface of the wafer as a laminated body. In the present disclosure, the expression "forming a certain layer (or film) on a wafer" may mean that the certain layer (or film) is directly formed on the surface (or exposed surface) of the wafer per se, or that the certain layer (or film) is formed on the surface of a certain layer or film formed on the wafer, namely on an outermost surface of the wafer as a laminated body.

In the present disclosure, the term "substrate" is interchangeably used with the term "wafer." Thus, with regard to the aforementioned description, the term "wafer" may be replaced with the term "substrate."

(Wafer Charging and Boat Loading)

When a plurality of wafers 200 is charged on the boat 217 (i.e., wafer charging), as illustrated in FIG. 1, the boat 217 holding the plurality of wafers 200 is lifted up by the boat elevator 115 to be loaded into the process chamber 201 (i.e., boat loading). In this state, the seal cap 219 seals the lower end portion of the reaction tube 203 via the O-ring 220*b*.

As described above, the SiO film, which is an oxide film, is formed as an insulting film on at least a portion in a surface of each of the wafers 200. This film becomes at least a portion of a base film for film formation in a film forming procedure to be described later. This film may be formed to fully or partially cover the surface of the wafer 200. In addition to the SiO film, a Si-containing film such as a silicon nitride film (SiN film), a silicon oxynitride film (SiON film), a silicon oxycarbonitride film (SiOCN film), a silicon oxycarbide film (SiOC film), a silicon carbonitride film (SiCN film), or the like; or a metal oxide film, i.e., a high dielectric constant (high-k) film, such as an aluminum oxide film (AlO film), a hafnium oxide film (HfO film), a zirconium oxide film (ZrO film), a titanium oxide film (TiO film), or the like, may be formed as the insulating film. As used herein, the insulating film (e.g., the oxide film, the nitride film, the oxynitride film, the oxycarbonitride film, the oxycarbide film, and the carbonitride film) includes a natural oxide film formed naturally due to exposure to the air during transfer, in addition to a film intentionally formed through predetermined processes such as CVD, plasma CVD, thermal oxidation, thermal nitridation, plasma oxidation, plasma nitridation, or the like.

(Pressure Adjustment and Temperature Adjustment)

The interior of the process chamber 201 (i.e., the space in which the wafers 200 exist) is evacuated (or depressurized) by the vacuum pump 246 to reach a desired pressure (or vacuum level). Here, the internal pressure of the process chamber 201 is measured by the pressure sensor 245, and the APC valve 244 is feedback-controlled based on the measured pressure information. The vacuum pump 246 is always kept in an operative state at least until a process on the wafers 200 is terminated. Further, the wafers 200 within the process chamber 201 are heated by the heater 207 to a desired film forming temperature. Here, a condition for applying current to the heater 207 is feedback-controlled based on the temperature information detected by the temperature sensor 263 in order to keep a desired temperature distribution in the interior of the process chamber 201. The heating of the interior of the process chamber 201 by the heater 207 is continuously performed at least until a process on the wafers 200 is terminated. Further, the boat 217 and wafers 200 begin to be rotated by the rotary mechanism 267. The rotation of the boat 217 and wafers 200 by the rotary mechanism 267 is continuously performed at least until a process on the wafers 200 is terminated.

(Pre-Treatment)

Thereafter, the surface of the SiO film formed on the surface of each of the wafers 200 is subjected to pre-treatment. In this pre-treatment, a layer containing Si as a predetermined element (e.g., a first element), i.e., a Si-containing layer as a seed layer, is formed, as an initial layer, on the surface of the SiO film. The seed layer may also be referred to as a Si seed layer.

In this operation, the valve 243*a* is opened to flow the DCS gas into the gas supply pipe 232*a*. A flow rate of the DCS gas is controlled by the MFC 241*a*, and the DCS gas is supplied from the nozzle 249*a* into the process chamber 201 and is exhausted through the exhaust pipe 231. As such, the DCS gas is supplied to the wafer 200. Concurrently, the valve 243*d* is opened to flow $N_2$ gas into the gas supply pipe 232*d*. The $N_2$ gas, whose flow rate is controlled by the MFC 241*d*, is supplied into the process chamber 201 together with the DCS gas and is exhausted through the exhaust pipe 231.

In addition, in order to prevent the DCS gas from seeping into the nozzles 249*b*, the valve 243*e* is opened to flow $N_2$ gas into the gas supply pipe 232*e*. The $N_2$ gas is supplied into the process chamber 201 through the gas supply pipe 232*b* and the nozzle 249*b* and is exhausted through the exhaust pipe 231.

In this operation, the APC valve 244 is appropriately controlled to set the internal pressure of the process chamber 201 to fall within a range of, for example, 1 to 2,666 Pa and, in some embodiments, 67 to 1,333 Pa. A supply flow rate of the DCS gas controlled by the MFC 241*a* is set to fall within a range of, for example, 1 to 2,000 sccm and, in some embodiment, 10 to 1,000 sccm. A supply flow rate of each of the $N_2$ gas controlled by each of the MFC 241*d* and 241*e* is set to fall within a range of, for example, 100 to 10,000 sccm.

A time period for supplying the DCS gas to the wafer 200, i.e., a gas supply time period (or an irradiation time period), is set to be longer than a time period for supplying the DCS gas in one cycle in the film forming procedure which will be described later. Specifically, the time period for supplying the DCS gas to the wafer 200 may fall within a range of, for example, 60 to 1,200 seconds, in some embodiment, 120 to 900 seconds and, in some embodiments, 300 to 600 seconds.

If the gas supply time period is less than 60 seconds, a thickness of the seed layer formed on the SiO film may be too small (for example, less than 0.05 nm), which makes the seed layer discontinuous. In this case, the film forming procedure which will be described later is performed in a state where the base SiO film is partially exposed. As a result, a reactant such as $NH_3$ gas for use in the film forming procedure may be directly supplied to the surface of the SiO film to modify (i.e., nitride) the surface of the SiO film. As a result, a layer having an undesired composition, such as a silicon oxynitride layer (SiON layer), that is, a transition layer, may be formed in an interface between the SiO film and the C-containing SiN film. In addition, as the seed layer becomes discontinuous, a pin hole to be described later is likely to occur in the C-containing SiN layer. In addition, the film thickness uniformity of the C-containing SiN film in the plane of the wafer 200 is likely to be deteriorated and the step coverage of the C-containing SiN film is also likely to be reduced.

When the gas supply time period is equal to or more than 60 seconds, the seed layer can be formed continuously, i.e., can become a continuous layer. When the gas supply time period is equal to or more than 120 seconds (i.e., two minutes) or further 300 seconds (i.e., five minutes), the seed layer can become a continuous layer with more ease and reliability. When the seed layer becomes the continuous layer, direct supply and contact of the reactant to the SiO film can be prevented, which suppresses formation of the transition layer. In addition, if a film thickness of the C-containing SiN film is 1 nm (10 Å) to 10 nm (100 Å), in some embodiment, 2 nm (20 Å) to 5 nm (50 Å) and, in some embodiment, 2 nm (20 Å) to 3 nm (30 Å), the C-containing SiN film can become a continuous film having no pin hole. Additionally, it is possible to increase flatness of the surface of the C-containing SiN film, i.e., the film thickness uniformity of the C-containing SiN film in the plane of the wafer 200. Further, it is possible to increase the step coverage of the C-containing SiN film.

If the gas supply time period exceeds 1,200 seconds (i.e., 20 minutes), the thickness of the seed layer formed on the SiO film may be too great (for example, greater than 0.2 nm), the film quality may be changed, for example, increase in concentration of impurities such as Cl in the film (particularly, in the base layer), when a stack of the seed layer and the C-containing SiN layer formed on the SiO film is viewed as a whole. In addition, a total consumption of the DCS gas in the pre-treatment may increase, which results in increase of film forming costs. When the gas supply time period is less than 1,200 seconds, the above problems can be avoided. In particular, when the gas supply time period is shorter than 900 seconds (i.e., 15 minutes) or, in some embodiments, shorter than 600 seconds (i.e., 10 minutes), the overall film quality of the stack of the seed layer and the C-containing SiN layer formed on the SiO film can be more suitably improved. In addition, the consumption of the DCS gas in the pre-treatment can be more suitably suppressed, which can result in further reduction of film formation costs.

When the seed layer is formed, the supply flow rate of the DCS gas may be set to be greater than the supply flow rate of the DCS gas in the film forming procedure to be described later. In this case, for example, the supply flow rate of the DCS gas for forming the seed layer may be set to 1,000 to 2,000 sccm, while the supply flow rate of the DCS gas in the film forming procedure to be described later may be set to 1 to 900 sccm. In addition, the internal pressure of the process chamber 201 may be set to be higher than the internal pressure of the process chamber 201 while the DCS gas is supplied during the film forming procedure described later. In this case, for example, the internal pressure of the process chamber 201 when the seed layer is formed may be 1,333 to 2,666 Pa, while the internal pressure of the process chamber 201 while the DCS gas is supplied during the film forming procedure described later may be set to 1 to 1,000 Pa. In the above cases, the formation rate of the seed layer can be increased, which can result in increase of the overall productivity of the film formation. In addition, the seed layer can become a continuous layer with more ease and reliability and formation of the transition layer in the film forming process can be more easily suppressed. In addition, it becomes easier to make the C-containing SiN film a continuous layer or improve the film thickness uniformity and the step coverage of the C-containing SiN film.

The temperature of the wafer 200 is set to 250 to 700 degrees C., in some embodiments, 300 to 650 degrees C. and, in some embodiments, 350 to 600 degrees C.

If the temperature of the wafer 200 is lower than 250 degrees C., it is difficult for the seed layer to be formed on the SiO film, which may result in difficulty in obtaining a practical forming rate of the seed layer. When the temperature of the wafer 200 is equal to or higher than 250 degrees C., this problem can be avoided. Further, when the temperature of the wafer 200 is equal to or higher than 300 degrees C., in some embodiments, 350 degrees C., the seed layer can be more reliably formed on the SiO film and the formation rate of the seed layer can be further increased.

If the temperature of the wafer 200 exceeds 700 degrees C., a CVD reaction is strengthened to cause an excessive gaseous reaction, and thus, the thickness uniformity of the seed layer in the plane of the wafer 200 is easily deteriorated, which may result in difficulty in controlling the uniformity. If the temperature of the wafer 200 is set to 700 degrees C. or lower, since a proper gaseous reaction can be caused, the deterioration of the thickness uniformity of the seed layer in the plane of the wafer 200 can be prevented and the control of the uniformity can be facilitated. In particular, if the temperature of the wafer 200 is set to 650 degrees C. or lower or, in some embodiments, 600 degrees C. or lower, a surface reaction becomes predominant over a gaseous reaction, and thus, the thickness uniformity of the seed layer in the plane of the wafer 200 can be easily secured and the thickness uniformity can be controlled more easily.

Accordingly, the temperature of the wafer 200 may be set to fall within a range of 250 to 700 degrees C., in some embodiments, 300 to 650 degrees C. and, in some embodiments, 350 to 600 degrees C. Within the above ranges of the temperature, it is possible to make proper progress of the pre-treatment on the wafer 200, i.e., the formation of the seed layer on the SiO film.

Under the foregoing conditions, when the DCS gas is supplied to the wafer 200, a layer containing Si and Cl, i.e., a Si-containing layer containing Cl, is formed, as the seed layer having a thickness of, for example, 0.05 nm (0.5 Å) to 0.2 nm (2 Å), on the SiO film on the surface of the wafer 200. The seed layer may contain H. That is, the seed layer may be a layer containing Si, Cl, and H. In addition, the seed layer is a layer including Si—Si bonds and also is a layer continuous and flat over the entire surface of the wafer 200. In addition, the surface of the seed layer becomes a surface terminated by a Si—Cl bond (hereinafter, simply referred to as a Cl terminator). In some cases, at least a portion of the surface of the seed layer may be a surface terminated by a Si—H bond (hereinafter, simply referred to as an H terminator). When the surface of the seed layer is Cl-terminated or at least partially H-terminated, it becomes a surface on which a first layer is more likely to be grown in the film forming procedure described later than the surface of the SiO film.

After the seed layer is formed, the valve 243a is closed to stop the supply of the DCS gas. In this operation, with the APC valve 244 opened, the interior of the process chamber 201 is evacuated by the vacuum pump 246 to remove residual gas remaining in the process chamber 201, such as the DCS gas which has not reacted or remains after contributing to the formation of the seed layer, out of the process chamber 201. In this operation, the valves 243d and 243e are opened to maintain the supply of the $N_2$ gas into the process chamber 201. The $N_2$ gas acts as a purge gas, and thus, the residual gas remaining in the process chamber 201 can be effectively removed from the process chamber 201.

In this operation, the residual gas remaining in the process chamber 201 may not be removed completely and the interior of the process chamber 201 may not be purged completely. When the residual gas remaining in the process chamber 201 is very small in amount, there may be no harmful effect on the subsequent film forming procedure. Here, a flow rate of the $N_2$ gas supplied into the process chamber 201 need not be high. For example, if approximately the same amount of the $N_2$ gas as the volume of the reaction tube 203 (or the process chamber 201) is supplied, the purging process can be performed without a harmful effect on Step 2. In this manner, since the interior of the process chamber 201 is not purged completely, a purging time period can be reduced and throughput can be improved. In addition, consumption of the $N_2$ gas can be restricted to a required minimal amount.

Examples of the precursor may include an inorganic precursor gas such as a monochlorosilane ($SiH_3Cl$, abbreviation: MCS) gas, a hexaochlorodisilane ($Si_2Cl_6$, abbreviation: HCDS) gas, a tetrachlorosilane, i.e., silicon tetrachloride ($SiCl_4$, abbreviation: STC) gas, a trichlorosilane ($SiHCl_3$, abbreviation: TCS) gas, a tetrafluorosilane ($SiF_4$, abbreviation: TFS) gas, a hexafluorodisilane ($Si_2F_6$, abbreviation: HFDS) gas, a trisilane ($Si_3H_8$, abbreviation: TS) gas, a disilane ($Si_2H_6$, abbreviation: DS) gas, a monosilane ($SiH_4$, abbreviation: MS) gas, or the like, and an organic precursor gas such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tertiary-butylamino)silane ($SiH_2[NH(C_4H_9)]_2$, abbreviation: BTBAS) gas, or the like, in addition to the DCS gas.

However, from the viewpoint of preventing the impurities such as C and N from seeping into the seed layer, it may be preferred for the pre-treatment to employ the inorganic precursor gas to the organic precursor gas. Specifically, a non-N-containing or non-C-containing precursor is preferable and a non-N-and-C-containing precursor is more preferable as a precursor used to form the seed layer. In addition, among the inorganic precursors, a precursor containing a halogen element is more preferably used. Further, in the case where a precursor containing Cl as the halogen element is used, in order to reduce the concentration of Cl contained in the seed layer, a precursor having less Cl included in its composition formula (e.g., in one molecule) is preferably used. For example, a gas containing Si, H, and Cl, such as DCS gas or MCS gas, is preferably used.

Examples of the inert gas may include rare gases such as Ar gas, He gas, Ne gas, Xe gas, and the like, in addition to the $N_2$ gas.

(Film Forming Process)

When the pre-treatment on the surface of the SiO film, i.e., the formation of the seed layer on the SiO film, is completed, the following three steps, i.e., Steps 1 to 3, are performed sequentially.

[Step 1]

(Supply of DCS Gas)

After the pre-treatment is terminated, the DCS gas is supplied to the wafer 200 in the process chamber 201.

The control for opening and closing the valves 243a, 243d, and 243e in Step 1 is performed in the same procedure as the control for opening and closing the valves 243a, 243d, and 243e in the pre-treatment. The DCS gas is supplied into the process chamber 201 through the gas supply pipe 232a and the nozzle 249a and is exhausted through the exhaust pipe 231. In this operation, the DCS gas is supplied to the wafer 200. A time period for supplying the DCS gas to the wafer 200, i.e., a gas supply time period (or an irradiation time period), may fall within a range of, for example, 1 to 120 seconds and, in some embodiments, 1 to 60 seconds, which is shorter than the supply time period of the DCS gas in the pre-treatment. For example, if the supply time period of the DCS gas in the pre-treatment is set to 60 to 120 seconds, the supply time period of the DCS gas in Step 1 is set to 1 to 30 seconds. Other process conditions are the same as those in the pre-treatment.

Under the foregoing conditions, the DCS gas is supplied to the wafer 200 to form a Si-containing layer which contains Cl, as a first layer, and has a thickness ranging, e.g., from less than one atomic layer to several atomic layers, on the seed layer. The Si-containing layer containing Cl may include either or both of a Si layer containing Cl and a DCS adsorption layer.

The Si-containing layer containing Cl is a generic term including a continuous layer and a discontinuous layer, each of which is constituted by Si and contains Cl, and a Si film containing Cl, which is generated by overlap of the above continuous and discontinuous layers. The continuous layer which is constituted by Si and contains Cl is sometimes referred to as a Si film containing Cl. Si constituting the Si layer containing Cl includes Si whose bond with Cl is not completely decomposed as well as Si whose bond with Cl is completely decomposed. The Si layer containing Cl may contain H.

The DCS adsorption layer includes a continuous adsorption layer and a discontinuous adsorption layer, each of which is constituted by DCS molecules. Specifically, the DCS adsorption layer includes an adsorption layer which is constituted by DCS molecules and has a thickness of one molecular layer or less. The DCS molecules constituting the DCS adsorption layer include DCS molecules whose Si—Cl bonds or Si—H bonds are partially decomposed. As such, the DCS adsorption layer may include a physical adsorption layer of DCS, a chemical adsorption layer of DCS, or both.

Here, a layer having a thickness smaller than one atomic layer refers to an atomic layer which is discontinuously formed, and a layer having a thickness equal to one atomic layer refers to an atomic layer which is continuously formed. Also, a layer having a thickness smaller than one molecular layer refers to a molecular layer which is discontinuously formed, and a layer having a thickness equal to one molecular layer refers to a molecular layer which is continuously formed. Further, the Si-containing layer containing Cl may include both the Cl-containing Si layer and the DCS adsorption layer. However, as described above, the Si-containing layer containing Cl will be represented by the expression of "one atomic layer," "several atomic layers," or the like.

Under a condition in which the DCS gas is self-decomposed (i.e., pyrolyzed), that is, under a condition in which a pyrolysis reaction of the DCS gas occurs, Si is deposited on the wafer 200 to form the Cl-containing Si layer. Under a condition in which the DCS gas is not self-decomposed (i.e., not pyrolyzed), that is, under a condition in which a pyrolysis reaction of the DCS gas does not occur, DCS is adsorbed onto the wafer 200 to form the DCS adsorption layer. In some embodiments, forming the Cl-containing Si layer on the wafer 200 is more desirable than forming the DCS adsorption layer on the wafer 200, in order to secure a higher film forming rate.

When the thickness of the first layer formed on the wafer 200 exceeds several atomic layers, a modification reaction in Step 3, which will be described later, does not affect the entire first layer. In addition, a minimum value of the thickness of the first layer formed on the wafer 200 is less than one atomic layer. Accordingly, the thickness of the first layer ranges from less than one atomic layer to several atomic layers in some embodiments. When the thickness of the first layer is one atomic layer or less, i.e., one atomic layer or less than one atomic layer, the effect of the modification reaction in Step 3, which will be described later, can be increased comparatively, and a time period required for the modification reaction in Step 3 can be reduced. A time period required for forming the first layer in Step 1 can also be reduced. As a result, a processing time period per cycle can be reduced and a total processing time period can also be reduced. As a result, the film forming rate can be increased. In addition, when the thickness of the first layer is one atomic layer or less, it may become easier to control the film thickness uniformity.

(Residual Gas Removal)

After the first layer is formed, the valve 243a is closed to stop the supply of the DCS gas. Then, according to the same procedure as the pre-treatment, residual gas remaining in the process chamber 201, such as the DCS gas which has not reacted or remains after contributing to the formation of the first layer, is removed out of the process chamber 201. In this operation, like the pre-treatment, the residual gas remaining in the process chamber 201 may not be removed completely.

Examples of the precursor gas may include the above-mentioned inorganic precursor gases and organic precursor gases, in addition to the DCS gas. Examples of the inert gas may include rare gases such as Ar gas, He gas, Ne gas, Xe gas, and the like, in addition to the $N_2$ gas.

[Step 2]
(Supply of $C_3H_6$ Gas)

After Step 1 is terminated, the $C_3H_6$ gas is supplied to the wafer 200 in the process chamber 201.

In this step, the control for opening and closing the valves 243c, 243d, and 243e is performed in the same manner as that for opening and closing the valves 243a, 243d, and 243e in the pre-treatment. The $C_3H_6$ gas is supplied into the process chamber 201 via the gas supply pipes 232c and 232b and the nozzle 249b and is exhausted through the exhaust pipe 231. As such, the $C_3H_6$ gas is supplied to the wafer 200. A supply flow rate of the $C_3H_6$ gas controlled by the MFC 241c is set to fall within a range of, for example, 100 to 10,000 sccm. The internal pressure of the process chamber 201 is set to fall within a range of, for example, 1 to 5,000 Pa and, in some embodiments, 1 to 4,000 Pa. A partial pressure of the $C_3H_6$ gas in the process chamber 201 is set to fall within a range of, for example, 0.01 to 4,950 Pa. A time period for supplying the $C_3H_6$ gas to the wafer 200, i.e., a gas supply time period (or an irradiation time period), may fall within a range of, for example, 1 to 200 seconds, in some embodiments, 1 to 120 seconds and, in some embodiments, 1 to 60 seconds. Other processing conditions are the same as those in Step 1.

Under the foregoing conditions, when the $C_3H_6$ gas is supplied to the wafer 200, a C-containing layer having a thickness of less than one atomic layer, i.e., a discontinuous C-containing layer, is formed on the surface of the first layer (i.e., the Si-containing layer containing Cl) formed on the wafer 200. The C-containing layer may include a C layer, a chemical adsorption layer of $C_3H_6$, or both. In addition, in order to ensure that the first layer with the C-containing layer formed thereon reacts with $NH_3$ gas to form a C-containing silicon nitride (SiN) layer in Step 3, which will be described later, in some embodiments, the supply of the $C_3H_6$ gas is stopped before the reaction of adsorption of $C_3H_6$ onto the surface of the first layer is saturated, i.e., before the C-containing layer such as the adsorption layer (chemical adsorption layer) of $C_3H_6$ formed on the surface of the first layer becomes a continuous layer (i.e., while the C-containing layer is a discontinuous layer).

(Residual Gas Removal)

After the C-containing layer is formed on the surface of the first layer, the valve 243c is closed to stop the supply of the $C_3H_6$ gas. Then, according to the same procedure as the pre-treatment, the residual gas remaining in the process chamber 201, such as the $C_3H_6$ gas which has not reacted or remains after contributing to the formation of the C-containing layer, and reaction byproducts are removed out of the process chamber 201. In this operation, like the pre-treatment, the residual gas remaining in the process chamber 201 may not be removed completely.

Examples of the C-containing gas may include hydrogen carbide-based gases such as acetylene ($C_2H_2$) gas and ethylene ($C_2H_4$) gas, in addition to the $C_3H_6$ gas.

[Step 3]
(Supply of $NH_3$ Gas)

After Step 2 is terminated, the $NH_3$ gas is supplied to the wafer 200 in the process chamber 201.

In this step, the control for opening and closing the valves 243b, 243d, and 243e is performed in the same manner as that for opening and closing the valves 243a, 243d, and 243e in the pre-treatment. The $NH_3$ gas is supplied from the gas supply pipe 232b into the process chamber 201 via the nozzle 249b and is exhausted through the exhaust pipe 231. As such, the $NH_3$ gas is supplied to the wafer 200. A supply flow rate of the $NH_3$ gas controlled by the MFC 241b is set to fall within a range of, for example, 100 to 10,000 sccm. The internal pressure of the process chamber 201 is set to fall within a range of, for example, 1 to 4,000 Pa and, in some embodiments, 1 to 3,000 Pa. A partial pressure of the $NH_3$ gas in the process chamber 201 is set to fall within a range of, for example, 0.01 to 3,960 Pa. When the internal pressure of the process chamber 201 is set to such a relatively high pressure range, the $NH_3$ gas can be thermally activated under a non-plasma state. Supplying the thermally activated $NH_3$ gas can cause a relatively soft reaction, which provides soft nitridation which will be described later. A time period for supplying the thermally-activated $NH_3$ gas to the wafer 200, i.e., a gas supply time period (or an irradiation time period), may fall within a range of, for example, 1 to 120 seconds and, in some embodiments, 1 to 60 seconds. Other processing conditions are the same as those in Step 1.

Under the foregoing conditions, when the $NH_3$ gas is supplied to the wafer 200, at least a portion of the first layer with the C-containing layer formed thereon (hereinafter, referred to as a "C-containing layer/first layer") is nitride (or modified). When the C-containing layer/first layer is modified, a second layer containing Si, C, and N, i.e., a SiN layer containing C, is formed on the wafer 200. When the second layer is formed, impurities such as Cl and H contained in the C-containing layer/first layer form a gaseous substance containing at least Cl and H during the modification reaction by the $NH_3$ gas and are discharged out of the process chamber 201. As such, the impurities such as Cl and the like in the C-containing layer/first layer are separated from the C-containing layer/first layer as the impurities are withdrawn or desorbed out of the C-containing layer/first layer. Accordingly, the second layer has fewer impurities such as Cl and H than the C-containing layer/first layer.

(Residual Gas Removal)

After the second layer is formed, the valve 243b is closed to stop the supply of the $NH_3$ gas. Then, according to the same procedure as Step 1, the residual gas remaining in the process chamber 201, such as the $NH_3$ gas which has not reacted or remains after contributing to the formation of the second layer, and reaction byproducts are removed out of the process chamber 201. In this operation, like Step 1, the residual gas remaining in the process chamber 201 may not be removed completely.

Examples of the N-containing gas may include hydrogen nitride-based gases such as diazene ($N_2H_2$) gas, hydrazine ($N_2H_4$) gas, $N_3H_8$ gas, and the like, and gases containing compounds thereof, in addition to the $NH_3$ gas. Examples of the inert gas may include rare gases such as Ar gas, He gas, Ne gas, Xe gas, and the like, in addition to the $N_2$ gas.

(Performing Predetermined Number of Times)

Figure 9:
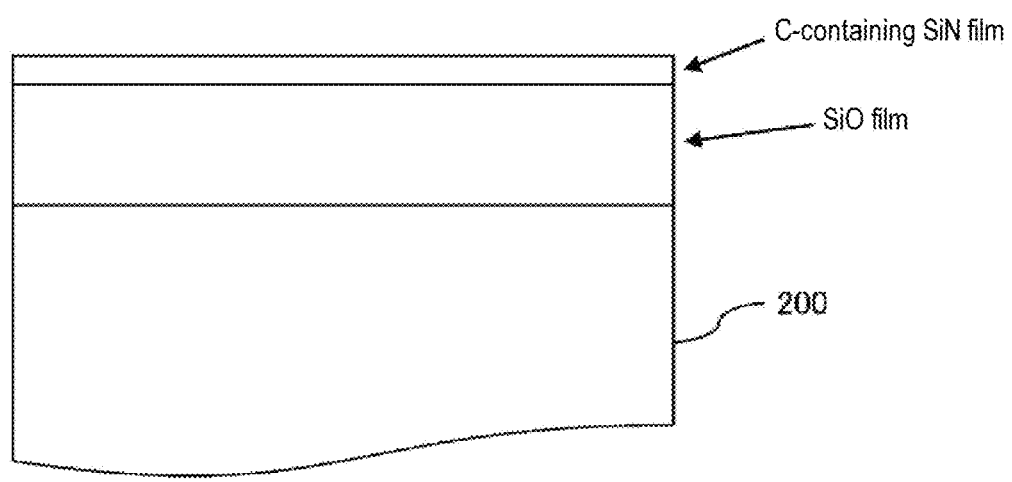
FIG. 9 is a view showing a sectional structure of a substrate after a film forming process is performed.

When a cycle in which Steps 1 to 3 as mentioned above are not performed simultaneously is performed once or more (e.g., a predetermined number of times), the SiN film having a predetermined composition and a predetermined film thickness can be formed on the wafer 200. FIG. 9 shows a sectional structure of the wafer 200 having the SiO film and the C-containing SiN film formed thereon in the above-mentioned order after the film forming process is performed.

Here, in the case where the C-containing SiN film is used as a protection film for protecting the SiO film when the wafer 200 is subjected to an etching process, the thickness of the C-containing SiN film is set to 0.2 nm (2 Å) to 10 nm (100 Å), in some embodiments, 0.5 nm (5 Å) to 10 nm (100 Å) and, in some embodiments, 1 nm (10 Å) to 10 nm (100 Å).

If the thickness of the C-containing SiN film is smaller than 0.2 nm, this film may not sufficiently function as a protection film. When the thickness of the C-containing SiN film is equal to or greater than 0.2 nm, this film can sufficiently function as the protection film. When the thickness of the C-containing SiN film is equal to or greater than 0.5 nm or, in some embodiments, equal to or greater than 1 nm, this film can more sufficiently function as the protection film.

If the film thickness exceeds 10 nm, even if no C is added into the SiN film, i.e., although the protection film is constituted by a non-C-containing SiN film, this film can sufficiently function as the protection film. This is because the effect of pin holes in the SiN film becomes sufficiently small if the film thickness exceeds 10 nm.

The term "pin hole" used herein refers to a path through which an etchant such as an etching gas or an etching solution supplied to a film infiltrates toward a base of the film (e.g., toward the SiO film in this embodiment). The pin hole is not limited to a physical hole. For example, the pin hole may be formed due to various factors such as local cracks in the film, decrease of local film density, increase of local defect density, change of local composition and crystal structure, and so on. If pin holes exist in a protection film, when an etchant is supplied to the protection film, the etchant may reach a base through the pin holes, thereby subjecting the base to etching damage. In addition, when the etchant infiltrates into the pin holes, the protection film may be etched, which may result in deteriorated function of the protection film.

If the thickness of the non-C-containing SiN film is small, the pin holes are likely to occur. When the protection film is formed of the non-C-containing SiN film, the effect of the pin holes may occur at the film thickness of 10 nm or smaller and may increase at the film thickness of 3 nm or smaller, providing insufficient function as the protection film. By contrary, when C is added into the SiN film, i.e., when the protection film is formed of the C-containing SiN film, the occurrence of pin holes can be suppressed to improve the function as the protection film. When the protection film is formed of the C-containing SiN film, it is confirmed that the protection film functions sufficiently well even at the film thickness of 10 nm or smaller or, in some embodiments, 3 nm or smaller. In this respect, particularly, when the thickness of the protection film need be 10 nm or smaller, it has a great significance to form the protection film as the C-containing SiN film.

From the above description, when the C-containing SiN film is used as the protection film, the film thickness is 0.2 nm to 10 nm, in some embodiments, 0.5 nm to 10 nm and, in some embodiment, 1 nm to 10 nm. In addition, when the thickness of the C-containing SiN film is 0.2 nm to 3 nm, in some embodiments, 0.5 nm to 3 nm and, in some embodiment, 1 nm to 3 nm, it is confirmed that the occurrence of pin holes can be suppressed and this film can function sufficiently well as the protection film.

In some embodiments, the above-mentioned cycle is repeated multiple times. That is, in some embodiments, the thickness of the C-containing SiN layer formed per cycle is set to be smaller than a desired film thickness and the foregoing cycle is repeated multiple times until a desired film thickness is obtained.

(Purging and Returning to Atmospheric Pressure)

After the film forming procedure is terminated, the valves 243d and 243e are opened to supply the $N_2$ gas from the gas supply pipes 232d and 232e, respectively, into the process chamber 201, and the $N_2$ gas is exhausted through the exhaust pipe 231. The $N_2$ gas acts as a purge gas. Thus, the interior of the process chamber 201 is purged with the purge gas and the residual gas remaining in the process chamber 201 and reaction byproducts are removed from the process chamber 201 (i.e., purging). Thereafter, an atmosphere in the process chamber 201 is substituted with the inert gas (i.e., inert gas substitution) and the internal pressure of the process chamber 201 returns to normal pressure (i.e., returning to atmospheric pressure).

(Boat Unloading and Wafer Discharging)

Thereafter, the seal cap 219 is lowered by the boat elevator 115 to open the lower end of the reaction tube 203. The processed wafers 200, supported by the boat 217, are unloaded out of the reaction tube 203 through the lower end of the reaction tube 203 (i.e., boat unloading). Then, the processed wafers 200 are discharged from the boat 217 (i.e., wafer discharging).

(3) Effects of the Embodiment

According to this embodiment, one or more effects are provided as described below.

(a) The C-containing SiN film is formed on the pre-treated surface of the SiO film, i.e., on the seed layer formed to continuously cover the entire region of the SiO film. The continuously formed seed layer acts as a block layer that blocks direct supply and contact of a reactant to the SiO film which is the base for film formation. Accordingly, the surface of the SiO film can be prevented from being modified by the reactant such as $NH_3$ gas or the like. Additionally, it is possible to prevent a transition layer from being formed in an interface between the SiO film and the C-containing SiN film.

In addition, the prevention of the formation of the transition layer has a great significance when the thickness of the C-containing SiN film is set as described above. This is because if a transition layer is formed between the SiO film and the C-containing SiN film, a smaller thickness of the C-containing SiN film provides a larger thickness ratio of the transition layer to the C-containing SiN film, which has a non-negligible effect. In addition, a natural oxide film may be formed on the surface of the C-containing SiN film. Even in this case, a smaller thickness of the C-containing SiN film provides a larger thickness ratio of the natural oxide film to the C-containing SiN film. That is, with the decrease of the thickness of the C-containing SiN film, a percentage of occupation of an area controlled to have a desired composition in the C-containing SiN film is likely to decrease. On the contrary, by preventing the formation of the transition layer as in this embodiment, even when the thickness of the C-containing SiN film is small, it is possible to increase the percentage of occupation of an area controlled to have a desired composition in the C-containing SiN film.

(b) Since the seed layer is continuously formed over the entire surface of the wafer 200, it is possible to uniformly align incubation periods of the C-containing SiN film, i.e., timings of start of growth of the first layer. Accordingly, it is possible to suppress an effect on the film thickness due to timing deviation of start of growth and improve the film thickness uniformity of the C-containing SiN film in the plane of the wafer 200. In addition, even when the thickness of the C-containing SiN film is set as above described, it is possible to form a pin hole-free film having good film thickness uniformity. In addition, it is possible to improve the step coverage of the C-containing SiN film.

(c) The C-containing SiN film is formed on the seed layer rather than the SiO layer. Therefore, when the cycle including Steps 1 to 3 is performed a predetermined number of times, the first layer begins to be formed from an earlier step without delay. As such, it is possible to reduce the incubation period of the C-containing SiN film, thereby increasing the overall productivity of film formation. In addition, the total consumption of precursor can be suppressed, which can result in reduction of film formation costs.

(d) By setting the DCS gas supply time period in the pre-treatment to be longer than the DCS gas supply time period per cycle in the film forming procedure, setting the DCS gas supply flow rate in the pre-treatment to be higher than the DCS gas supply flow rate in the film forming procedure, or setting the internal pressure of the process chamber 201 in the pre-treatment to be higher than the internal pressure of the process chamber 201 in the DCS gas supply in the film forming procedure, it is possible to form a proper (or reliable) continuous seed layer with ease and reliability. As a result, the above-described effects can be easily obtained.

In addition, by setting the DCS gas supply flow rate in the pre-treatment to be greater than the DCS gas supply flow rate in the film forming procedure or setting the internal pressure of the process chamber 201 in the pre-treatment to be greater than the internal pressure of the process chamber 201 in the DCS gas supply in the film forming procedure, it is possible to increase a formation rate of the seed layer, thereby increasing the overall productivity of film formation.

(e) By adding C in the SiN film, although the thickness of this film is small, the film can become a film without pin holes, i.e., a pin hole-free film. Therefore, when this film is used as a protection film, it is possible to avoid etching damage of the SiO film which is caused by the etching process. In addition, since the protection film is the pin hole-free film, it is possible to suppress etching of the protection film which is caused by the etching process, thereby avoiding deterioration of the function of the C-containing SiN film as the protection film.

(f) By adding C in the SiN film, this film can become a film having high resistance to an etchant such as HF or the like (i.e., high etching resistance). Therefore, when this film is used as a protection film, it is possible to suppress etching of the protection layer which is caused by the etching process, thereby allowing this film to maintain the function as the protection film.

(g) In the film forming procedure, since the DCS gas supply to the wafer 200, the $C_3H_6$ gas supply to the wafer 200, and the $NH_3$ gas supply to the wafer 200 are performed non-simultaneously, it is possible to improve the step coverage and film thickness controllability of the C-containing SiN film over the case where the above gases are supplied simultaneously.

(h) The above-described effects can be equally achieved even in the cases where gases other than the DCS gas are used as the precursor gas, where gases other than the $C_3H_6$ gas are used as the C-containing gas, where gases other than the $NH_3$ gas are used as the N-containing gas, and where inert gases other than the $N_2$ gas are used as the purge gas.

(5) Modifications

The film forming process in this embodiment is not limited to the above-described configurations but may be altered as the following modifications.

For example, according to the following film forming sequence, a silicon carbonitride film (SiCN film), i.e., a C-containing SiN film, may be formed as a film containing Si, C, and N on the surface of the SiO film.

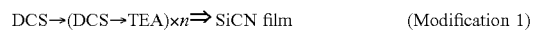
(Modification 1)

In addition, for example, according to the following film forming sequence, a silicon oxycarbonitride film (SiOCN film) may be formed as a film containing Si, O, C, and N on the surface of the SiO film, and a silicon oxycarbide film (SiOC film) may be formed as a film containing Si, O, and C on the surface of the SiO film. As such, a C-containing SiON film or a C-containing SiO film may be formed on the SiO film.

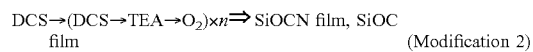
(Modification 2)

Figure 5:
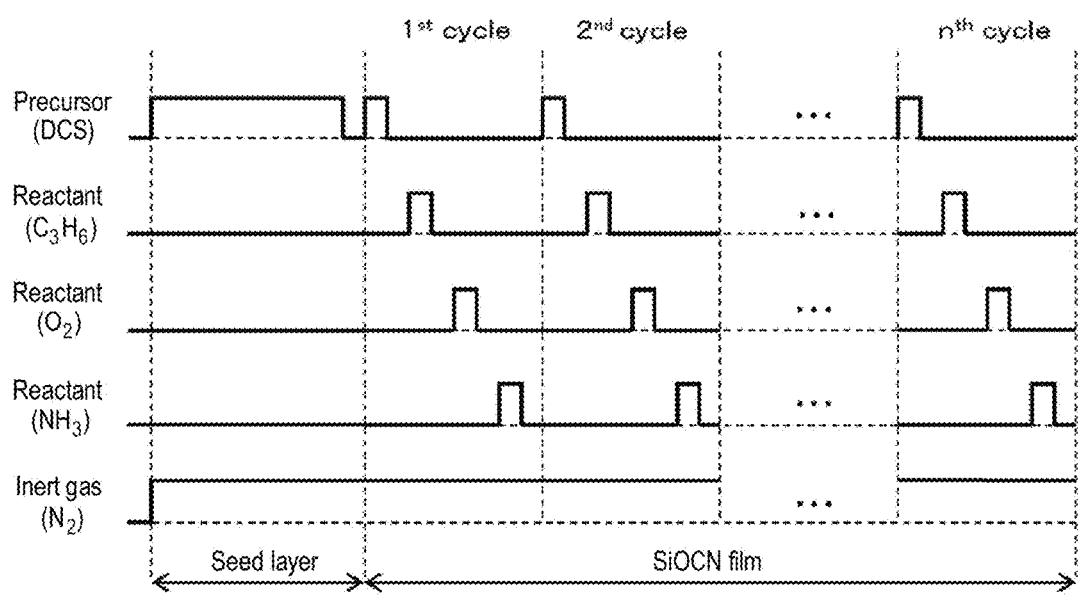
FIG. 5 is a diagram showing gas supply timings in Modification 4 of the film forming sequence according to one embodiment of the present disclosure.

In addition, for example, according to the following film forming sequences, a SiOCN film, i.e., a C-containing SiON film, may be formed on the surface of the SiO film. FIG. 5 is a diagram showing gas supply timings in Modification 4.

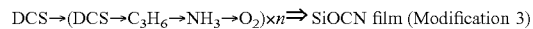

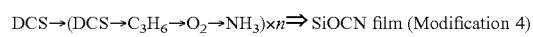

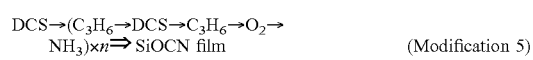

Figure 6:
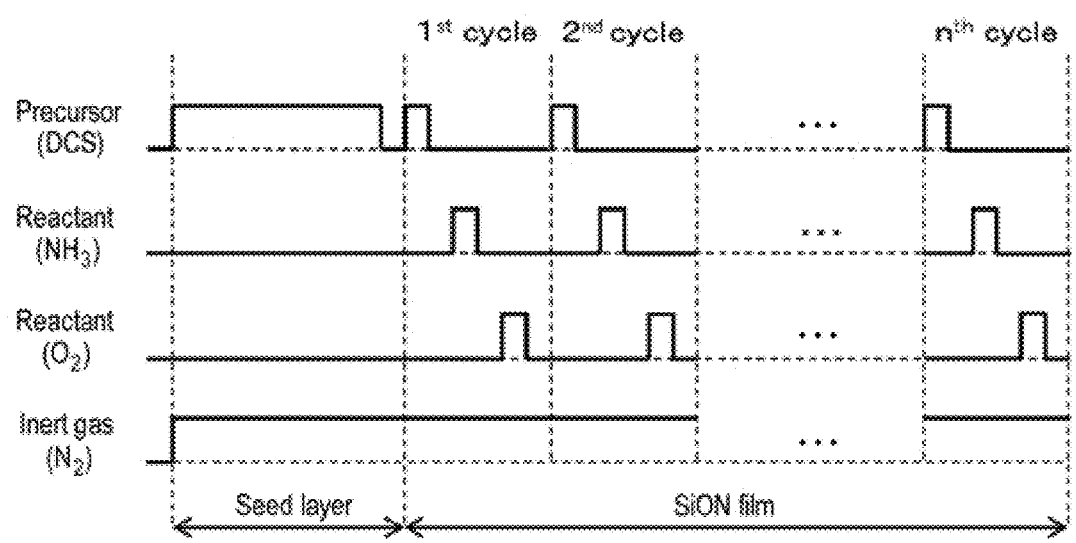
FIG. 6 is a diagram showing gas supply timings in Modification 6 of the film forming sequence according to one embodiment of the present disclosure.

In addition, for example, according to the following film forming sequence, a silicon oxynitride film (SiON film) may be formed as a film containing Si, O, and N on the surface of the SiO film. FIG. 6 is a diagram showing gas supply timings in Modification 6.

(Modification 6)

In addition, for example, according to the following film forming sequence, a silicon nitride film (SiN film) may be formed as a film containing Si and N on the surface of the SiO film.

(Modification 7)

Figure 7:
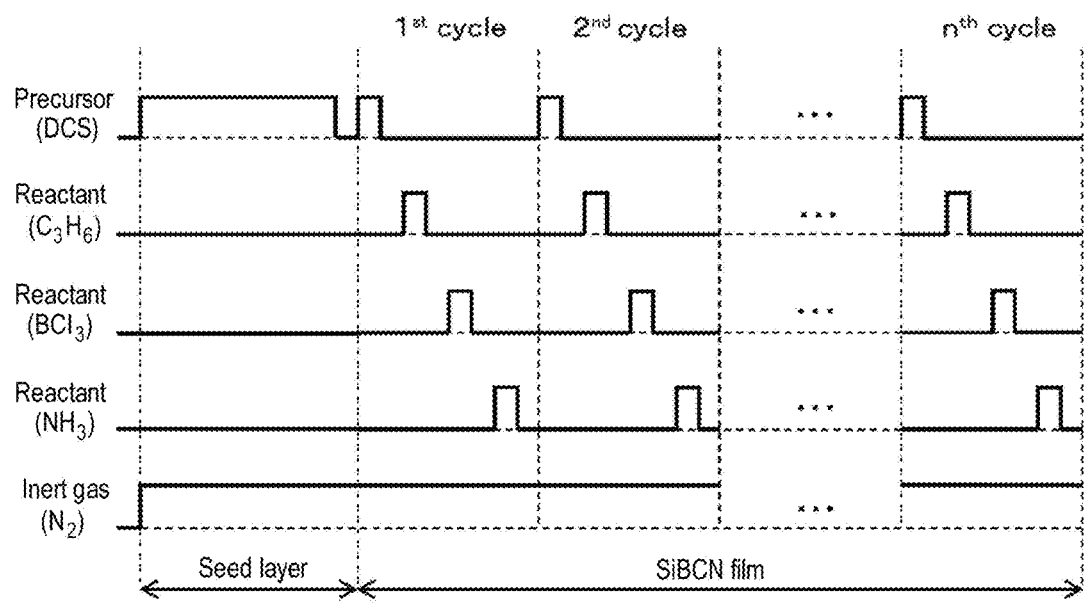
FIG. 7 is a diagram showing gas supply timings in Modification 8 of the film forming sequence according to one embodiment of the present disclosure.

In addition, for example, according to the following film forming sequences, a silicon borocarbonitride film (SiBCN film), i.e., a C-containing SiBN film, may be formed as a film containing Si, B, C, and N on the surface of the SiO film. FIG. 7 is a diagram showing gas supply timings in Modification 8.

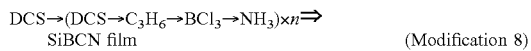
(Modification 8)

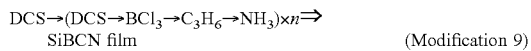
(Modification 9)

In addition, for example, according to the following film forming sequences, a SiBCN film containing a borazine ring skeleton, i.e., a C-containing SiBN film containing a borazine ring skeleton, may be formed on the surface of the SiO film.

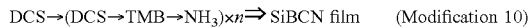
(Modification 10)

(Modification 11)

Figure 8:
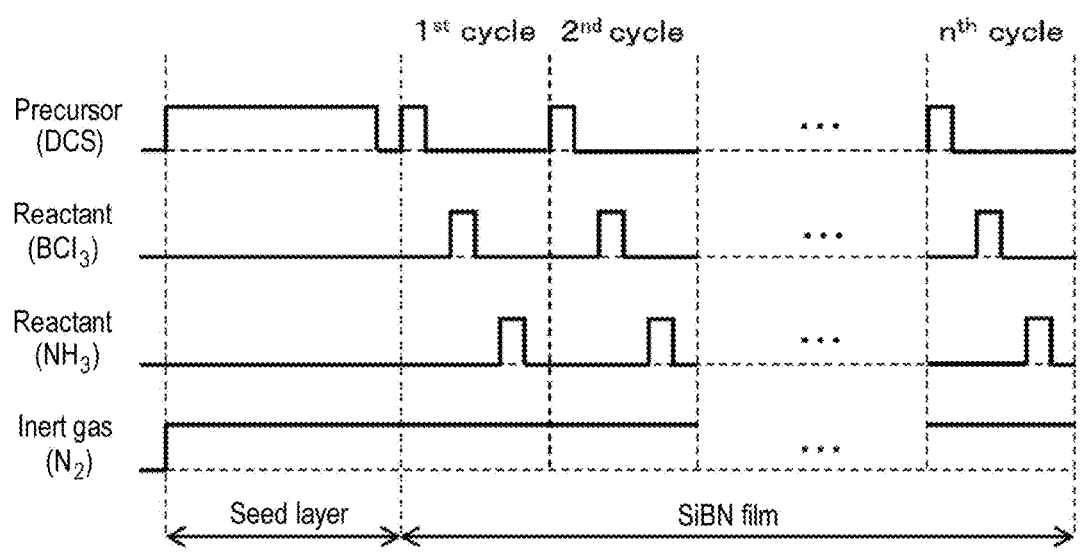
FIG. 8 is a diagram showing gas supply timings in Modification 12 of the film forming sequence according to one embodiment of the present disclosure.

In addition, for example, according to the following film forming sequence, a silicon boronitride film (SiBN film) may be formed as a film containing Si, B, and N on the surface of the SiO film. FIG. 8 is a diagram showing gas supply timings in Modification 12.

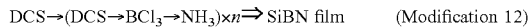
(Modification 12)

In the above-described modifications, in the step of supplying the TEA gas to the wafer 200, a supply flow rate of TEA gas controlled by the MFC 241b is set to fall within a range of, for example, 100 to 10,000 sccm. Other process conditions are the same as those in Step 3 in the film forming sequence shown in FIG. 4. Examples of the N-and-C-containing gas may include an ethylamine-based gas such as diethylamine (($C_2H_5$)$_2$NH, abbreviation: DEA), monoethylamine ($C_2H_5NH_2$, abbreviation: MEA), or the like, and a methylamine-based gas such as trimethylamine (($CH_3$)$_3$N, abbreviation: TMA), dimethylamine (($CH_3$)NH, abbreviation: DMA), a monomethylamine ($CH_3NH_2$, abbreviation: MMA), or the like, in addition to the TEA gas.

In addition, in the step of supplying the $O_2$ gas to the wafer 200, a supply flow rate of $O_2$ gas controlled by the MFC 241b is set to fall within a range of, for example, 100 to 10,000 sccm. Other process conditions are the same as those in Step 3 in the film forming sequence shown in FIG. 4. Examples of the $O_2$ gas may include nitrous oxide ($N_2O$), nitrogen monoxide (NO) gas, gas nitrogen dioxide ($NO_2$) gas, ozone ($O_3$) gas, mixture of hydrogen ($H_2$) gas and $O_2$ gas, mixture of $H_2$ gas and $O_3$ gas, vapor ($H_2O$), carbon monoxide (CO) gas, carbon dioxide ($CO_2$) gas, and the like, in addition to the $O_2$ gas.

In addition, in the step of supplying the $BCl_3$ gas to the wafer 200, a supply flow rate of $BCl_3$ gas controlled by the MFC 241b is set to fall within a range of, for example, 100 to 10,000 sccm. Other process conditions are the same as those in Step 3 in the film forming sequence shown in FIG. 4. Examples of the B-containing gas may include monochloroborane ($BClH_2$) gas, dichloroborane ($BCl_2H$) gas, trifluoroborane ($BFl_3$) gas, tribromoborane ($BBr_3$) gas, a diborane ($B_2H_6$) gas, and the like, in addition to the $BCl_3$ gas.

In addition, in the step of supplying the TMB gas to the wafer 200, a supply flow rate of TMB gas controlled by the MFC 241b is set to fall within a range of, for example, 1 to 1,000 sccm. Other process conditions are the same as those in Step 3 in the film forming sequence shown in FIG. 4. Examples of the B-containing gas containing a borazine ring skeleton may include TEB gas, TPB gas, TIPB gas, TBB gas, TIBB gas, and the like, in addition to the TMB gas.

Other steps may have the same procedures and process conditions as the steps in the film forming sequence shown in FIG. 4.

<Other Embodiments of the Present Disclosure>

The embodiments of the present disclosure have been described in detail. However, the present disclosure is not limited to the foregoing embodiments and its modifications but may be variously modified without departing from the spirit of the present disclosure.

For example, it has been illustrated in the above embodiment that the seed layer is formed on the surface of an insulating film by supplying the DCS gas to the wafer having the insulating film formed thereon. However, the present disclosure is not limited thereto.

For example, by supplying a halosilane precursor having a Si—Si bond to the wafer having the insulating formed thereon, the seed layer may be formed on the surface of the SiO film. For example, by supplying HCDS gas to the wafer having the insulating film formed thereon, the seed layer may be formed on the surface of the SiO film.

In addition, for example, by supplying an alkylhalosilane precursor having a Si—Si—C bond to the wafer having the insulating formed thereon, the seed layer may be formed on the surface of the insulating film. For example, by supplying 1,1,2,2-tetrachloro-1,2-dimethyldisilane (($CH_3$)$_2$Si$_2$Cl$_4$, abbreviation: TCDMDS) gas to the wafer having the SiO film formed thereon, the seed layer may be formed on the surface of the SiO film.

In addition, for example, by supplying a plurality of species of precursors to the wafer having the insulating film formed thereon, the seed layer may be formed. For example, by alternately supplying HCDS gas and 3DMAS gas to the wafer having the SiO film formed thereon a predetermined number of times, the seed layer may be formed on the surface of the SiO film.

The above cases have the same process conditions as the above-described embodiments.

The above-described film forming sequence may be properly performed also in the case of forming a metal-based film containing a metal element, such as titanium (Ti), zirconium (Zr), hafnium (Hf), tantalum (Ta), niobium (Nb), aluminum (Al), molybdenum (Mo), tungsten (W), or the like, on the surface of the insulating film.

When the metal-based film is formed, as a precursor, an inorganic metal gas containing a metal element and a halogen element, such as titanium tetrachloride ($TiCl_4$) gas, titanium tetrafluoride ($TiF_4$) gas, zirconium tetrachloride ($ZrCl_4$) gas, zirconiumtetrafluoride ($ZrF_4$ gas, hafnium tetrachloride ($HfCl_4$) gas, hafnium tetrafluoride ($HfF_4$) gas, tantalum pentachloride ($TaCl_5$) gas, tantalum pentafluoride ($TaF_5$) gas, niobium pentaehloride ($NbCl_5$) gas, niobium pentafluoride ($NbF_5$) gas, aluminum trichloride ($AlCl_3$) gas, aluminum trifluoride (AlF$_3$) gas, molybdenum pentachloride (MoCl$_5$) gas, molybdenum pentafluoride (MoF$_5$) gas, tungsten hexachloride (WCl$_6$) gas, tungsten hexafluoride (WF$_6$) gas, or the like, may be used. In addition, when the seed layer is formed, like the above embodiment, a non-N-containing or non-C-containing precursor and, in some embodiments, a non-N-and-C-containing precursor may be used. As a reactant, the same gas as the above-described embodiment may be used.

For example, according to the following film forming sequences, a tantalum carbonitride film (TaCN film), a tantalum aluminum carbide film (TaAlC film), a tantalum nitride film (TaN film), a tantalum silicon nitride film (TaSiN film), a tantalum aluminum nitride film (TaAlN film), a titanium carbonitride film (TiCN film), a titanium aluminum carbide film (TiAlC film), a titanium nitride film (TiN film), a titanium silicon nitride film (TiSiN film), a titanium aluminum nitride film (TiAlN film), or the like may be formed on the surface of the insulating film formed on the wafer. Each step in these film forming sequences may have the same procedure and process conditions as the above-described embodiment.

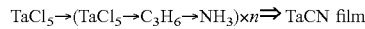

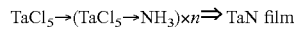

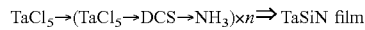

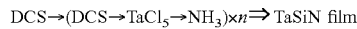

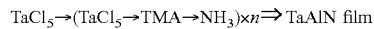

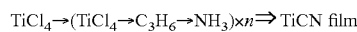

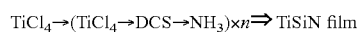

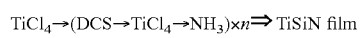

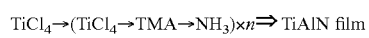

In this manner, the present disclosure can be appropriately applied to the case of forming a film containing at least one selected from a group consisting of a semiconductor element and a metal element, as a first element, and at least one selected from a group consisting of C, N, O, and B, as second to fourth elements. In addition, the second to fourth elements may include at least one selected from a group consisting of a semiconductor element and a metal element. For example, the second to fourth elements may include at least one selected from a group consisting of C, N, O, B, Si, Ge, Ti, Zr, Hf, Nb, Ta, Mo, W, and Al. In some embodiments, the second to fourth elements may be different elements.

The processing recipe for use in forming the above various kinds of thin films (i.e., the program in which procedures or process conditions of the film forming process are described) may be individually prepared (a plurality of things is prepared) based on contents of the film forming process (a kind of film to be formed, a composition ratio, a film quality, a film thickness, procedures, process conditions, and the like). In addition, when a substrate process is initiated, a suitable processing recipe may be selected among a plurality of processing recipes based on contents of the substrate process. Specifically, the plurality of recipes individually prepared depending on contents of the substrate process may be previously stored (or installed) in the memory device 121c provided in the substrate processing apparatus via an electrical communication line or a recording medium (e.g., the external memory device 123) in which the recipes are recorded. In addition, when the film forming process is initiated, the CPU 121a provided in the substrate processing apparatus may appropriately select a suitable recipe among the plurality of recipes stored in the memory device 121c based on contents of the substrate process. With this configuration, thin films having a variety of film types, composition ratios, film qualities and film thicknesses can be formed with high versatility and high reproducibility in one substrate processing apparatus. In addition, since an operator's work load (e.g., a load of inputting procedures or process conditions, or the like) can be lessened, it is possible to rapidly initiate the substrate processing while avoiding an operational error.

The above-described processing recipe is not limited to a newly prepared recipe and may be prepared, for example, by modifying an existing recipe that is already installed in the substrate processing apparatus. When the recipe is modified, the modified recipe may be installed on the substrate processing apparatus via an electrical communication line or a recording medium in which the recipe is recorded. In addition, the recipe previously installed in the substrate processing apparatus may be directly changed by manipulating the input/output device 122 of the substrate processing apparatus.

In the above-described embodiment, an example of using a batch type substrate processing apparatus in which a plurality of substrates is processed at once for forming a thin film has been illustrated. The present disclosure is not limited thereto but may be appropriately applied to the case in which a single-wafer type substrate processing apparatus which processes one or several substrates at a time is used to form a thin film. In addition, in the above-described embodiment, an example of using a substrate processing apparatus having a hot wall type processing furnace in forming a thin film. The present disclosure is not limited thereto but may be appropriately applied to the case in which a substrate processing apparatus having a cold wall type processing furnace is used to form a thin film. In those cases, procedures and process conditions may be the same as those in the above-described embodiment.

Figure 13:
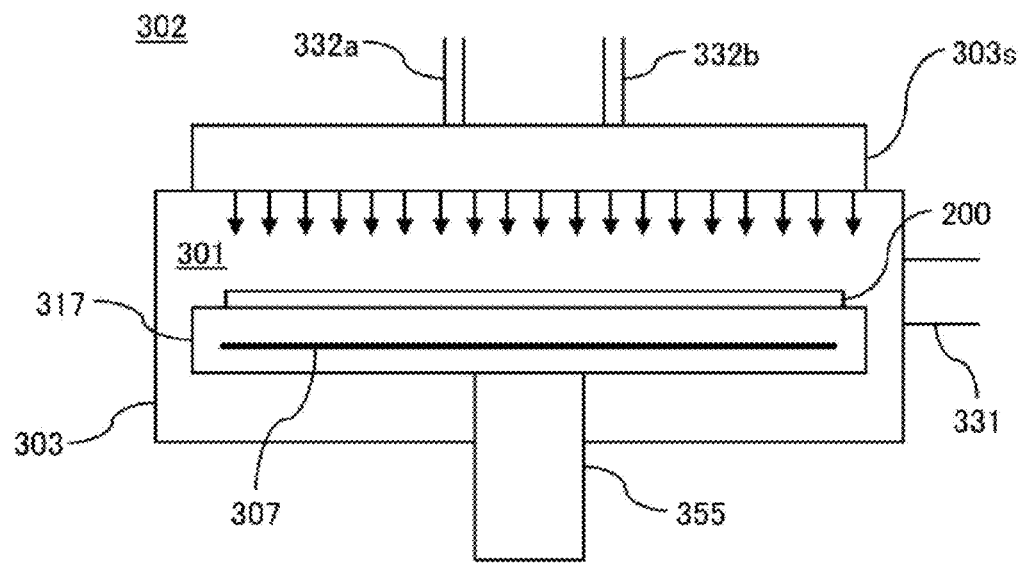
FIG. 13 is a schematic view illustrating a configuration of a vertical processing furnace of a substrate processing apparatus suitably used in another embodiment of the present disclosure, in which the processing furnace is shown in a longitudinal sectional view.

For example, the present disclosure may be appropriately applied to the case in which a substrate processing apparatus having a processing furnace 302 shown in FIG. 13 is used to form a film. The processing furnace 302 includes a process vessel 303 forming a process chamber 301, a shower head 303s as a gas supply part which supplies gas in the form of a shower into the process chamber 301, a support base 317 which supports one or several wafers 200 in a horizontal position, a rotary shaft 355 which supports the support base 317 from a bottom end of the support base 317, and a heater 307 installed in the support base 317. An inlet (i.e., an introduction port) of the shower head 303s is connected with a gas supply port 332a for supplying the above-described precursor and a gas supply port 332b for supplying the above-described reactant. The gas supply port 332a is connected with a precursor supply system which is similar to the precursor supply system in the above-described embodiment. The gas supply port 332b is connected with a reactant supply system which is similar to the reactant supply system in the above-described embodiment. A gas distribution plate for supplying a gas in the form of a shower into the process chamber 301 is installed in an outlet (i.e., a gas discharging port) of the shower head 303s. The shower head 303s is installed at a position opposing (or facing) the surfaces of the wafers 200 loaded into the process chamber 301. An exhaust port 331 for exhausting the interior of the process chamber 301 is installed in the process vessel 303. The exhaust port 331 is connected with an exhaust system which is similar to the exhaust system in the above-described embodiment.

Figure 14:
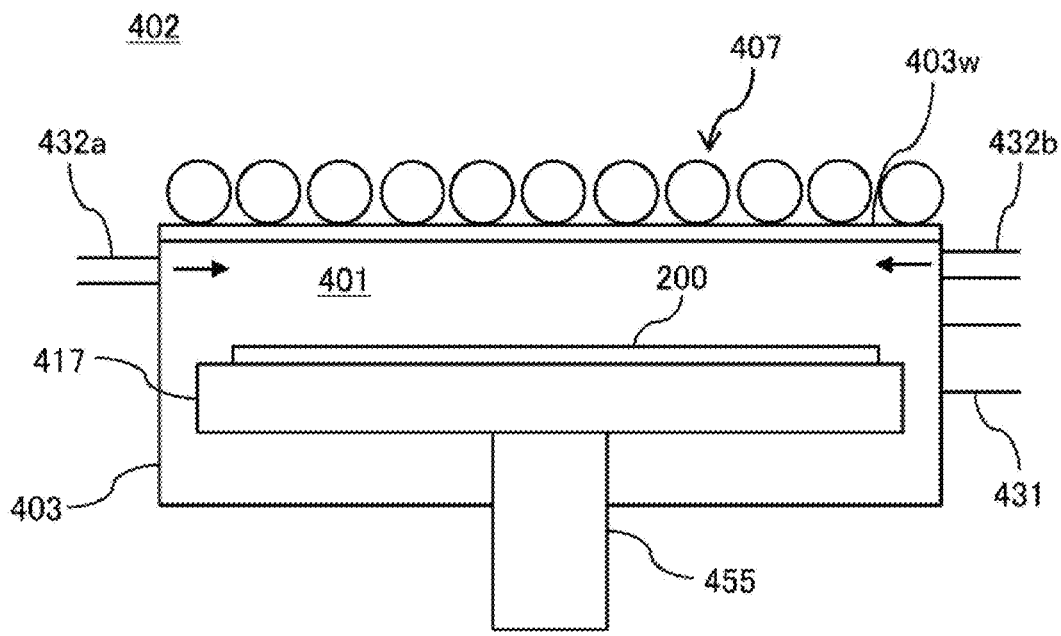
FIG. 14 is a schematic view illustrating a configuration of a vertical processing furnace of a substrate processing apparatus suitably used in still another embodiment of the present disclosure, in which the processing furnace is shown in a longitudinal sectional view.

In addition, for example, the present disclosure may be appropriately applied to the case in which a substrate processing apparatus having a processing furnace 402 shown in FIG. 14 is used to form a film. The processing furnace 402 includes a process vessel 403 forming a process chamber 401, a support base 417 which supports one or several wafers 200 in a horizontal position, a rotary shaft 455 which supports the support base 417 from a bottom end of the support base 417, a lamp heater 407 which performs light irradiation on the wafers 200 in the process vessel 403, and a quartz window 403w which transmits the light from the lamp heater 407. The process vessel 403 is connected with a gas supply port 432a for supplying the above-described precursor and a gas supply port 432b for supplying the above-described reactant. The gas supply port 432a is connected with a precursor supply system which is similar to the precursor supply system in the above-described embodiment. The gas supply port 432b is connected with a reactant supply system which is similar to the reactant supply system in the above-described embodiment. The gas supply ports 432a and 432b are installed in the lateral side of end portions of the wafers 200 loaded into the process chamber 401, i.e., at a position which does not oppose (or face) the surfaces of the wafers 200 loaded into the process chamber 401. An exhaust port 431 for exhausting the interior of the process chamber 401 is installed in the process vessel 403. The exhaust port 431 is connected with an exhaust system which is similar to the exhaust system in the above-described embodiment.

Although the above substrate processing apparatuses are used, a film forming process can be performed with the same sequence and process conditions as the above-described embodiment and modifications.

In addition, the above-described embodiment and modifications may be used in proper combination. Process conditions in such cases may be the same as those in the above-described embodiment.

[Embodiment Examples]

As embodiment examples, the substrate processing apparatus in the above-described embodiment was used to manufacture Samples 1 and 2 according to the film forming sequence shown in FIG. 4. In Sample 1, a C-containing SiN film was directly formed on an exposed surface of a silicon wafer. In Sample 2, a C-containing SiN film was formed on a surface of a SiO film formed on the silicon wafer. Both of Samples 1 and 2 were manufactured using DCS gas as a precursor gas, NH$_3$ gas as an N-containing gas, and C$_3$H$_6$ gas as a C-containing gas. The DCS gas supply time period in the pre-treatment was set to 60 to 90 seconds. The DCS gas supply time period in the film forming process was set to 10 to 15 seconds. Other process conditions were the same as those in the above-described embodiment. Sample 1 had the same procedures and process conditions as Sample 2 except for a base for film formation.

As comparative examples, the substrate processing apparatus in the above-described embodiment was used to manufacture Samples 3 and 4. In the Comparative Example, no pre-treatment was performed before a film forming procedure. Other procedures and process conditions were the same as those in the embodiment examples. That is, in Sample 3, a C-containing SiN film was directly formed on an exposed surface of the silicon wafer without pre-treatment. In Sample 4, a C-containing SiN film was formed on a surface of a SiO film formed on the silicon wafer without pre-treatment. Sample 3 had the same procedures and process conditions as Sample 4 except for a base for film formation.

Figure 10:
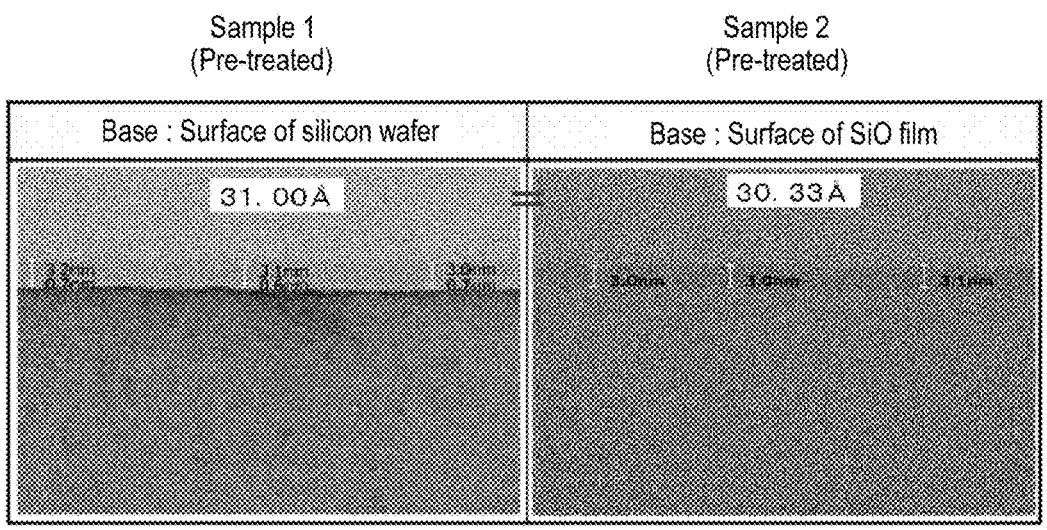
FIG. 10 is a section-enlarged photograph of Samples 1 and 2 manufactured in embodiment examples.
Figure 11:
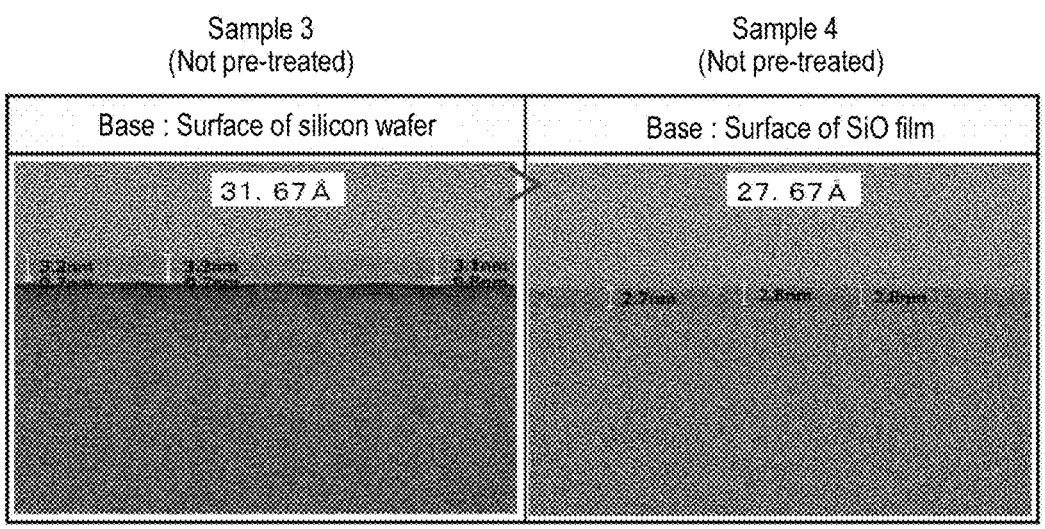
FIG. 11 is a section-enlarged photograph of Samples 3 and 4 manufactured in comparative Examples.

A thickness of the C-containing SiN film formed in each of Samples 1 to 4 was measured. FIG. 10 shows section-enlarged photographs of Samples 1 and 2 manufactured in the embodiment examples. FIG. 11 shows section-enlarged photographs of Samples 3 and 4 manufactured in the comparative examples.

As shown in FIG. 10, the thickness of the C-containing SiN film in Sample 1 is 31.00 Å and the thickness of the C-containing SiN film in Sample 2 is 30.33 Å. In addition, as shown in FIG. 11, the thickness of the C-containing SiN film in Sample 3 is 31.67 Å and the thickness of the C-containing SiN film of Sample 4 is 27.67 Å. As such, it was found that a difference in the thickness of the C-containing SiN film between Samples 3 and 4 which were subjected to no pre-treatment was 4 Å, whereas a difference in the thickness of the C-containing SiN film between Samples 1 and 2 which were subjected to the pre-treatment was 0.67 Å, which is relatively small. From this fact, it is confirmed that the a period can be significantly reduced to start the film forming procedure without delay when a film is formed on the surface of the SiO film, by performing the pre-treatment.

<Aspects of the Present Disclosure>

Hereinafter, some aspects of the present disclosure will be supplemented.

(Supplementary Note 1)

According to an aspect of the present disclosure, there is provided a method of manufacturing a semiconductor device, including pre-treating a surface of an insulating film formed on a substrate by supplying a precursor containing a first element and a halogen element to the substrate; and forming a film containing the first element and a second element on the pre-treated surface of the insulating film by performing a cycle a predetermined number of times, the cycle including supplying the precursor to the substrate; and supplying a reactant containing the second element to the substrate, wherein the act of supplying the precursor and the act of supplying the reactant are performed non-simultaneously.

(Supplementary Note 2)

In the method according to Supplementary Note 1, a supply condition of the precursor in the act of pre-treating the surface of the insulating film is different from a supply condition of the precursor per performance of the cycle in the act of forming the film.

(Supplementary Note 3)

In the method according to Supplementary Note 1 or 2, a supply time period of the precursor in the act of pre-treating the surface of the insulating film is set to be longer than a supply time period of the precursor per performance of the cycle in the act of forming the film.

(Supplementary Note 4)

In the method according to any one of Supplementary Notes 1 to 3, a supply flow rate of the precursor in the act of pre-treating the surface of the insulating film is set to be greater than a supply flow rate of the precursor in the act of forming the film.

(Supplementary Note 5)

In the method according to any one of Supplementary Notes 1 to 4, a pressure of a space where the substrate exists when the precursor is supplied in the act of pre-treating the surface of the insulating film is set to be greater than a pressure of a space where the substrate exists when the precursor is supplied in the act of forming the film.

(Supplementary Note 6)

In the method according to any one of Supplementary Notes 1 to 5, the act of pre-treating the surface of the insulating film includes forming a seed layer on the surface of the insulating film.

(Supplementary Note 7)

In the method according to any one of Supplementary Notes 1 to 6, the act of pre-treating the surface of the insulating film includes forming a seed layer containing the halogen element on the surface of the insulating film.

(Supplementary Note 8)

In the method according to any one of Supplementary Notes 1 to 7, the act of pre-treating the surface of the insulating film includes forming a seed layer containing the first element and the halogen element on the surface of the insulating film.

(Supplementary Note 9)

In the method according to any one of Supplementary Notes 6 to 8, a thickness of the seed layer is greater than or equal to 0.05 nm (0.5 Å) and smaller than or equal to 0.2 nm (2 Å).

(Supplementary Note 10)

In the method according to any one of Supplementary Notes 1 to 9, the cycle further includes supplying a reactant containing a third element to the substrate, and a film containing the first element, the second element, and the third element is formed on the pre-treated surface of the insulating film by performing the cycle the predetermined number of times in the act of forming the film. In some embodiments, the act of supplying the precursor, the act of supplying the reactant containing the second element, and the act of supplying the reactant containing the third element are performed non-simultaneously.

(Supplementary Note 11)

In the method according to Supplementary Note 10, the cycle further includes supplying a reactant containing a fourth element to the substrate, and a film containing the first element, the second element, the third element and the fourth element is formed on the pre-treated surface of the insulating film by performing the cycle the predetermined number of times in the act of forming the film. In some embodiments, the act of supplying the precursor, the act of supplying the reactant containing the second element, the act of supplying the reactant containing the third element, and the act of supplying the reactant containing the fourth element are performed non-simultaneously.

(Supplementary Note 12)

In the method according to any one of Supplementary Notes 1 to 11, the precursor does not contain nitrogen. In some embodiment, the precursor does not contain carbon. In some embodiment, the precursor contains neither nitrogen nor carbon.

(Supplementary Note 13)

In the method according to any one of Supplementary Notes 1 to 12, the first element includes at least one selected from a group consisting of a semiconductor element and a metal element and the halogen element includes at least one selected from a group consisting of Cl and F. For example, the semiconductor element includes at least one selected from a group consisting of Si and Ge. In addition, for example, the metal element includes at least one selected from a group consisting of Ti, Zr, Hf, Nb, Ta, Mo, W, and Al.

(Supplementary Note 14)

In the method according to any one of Supplementary Notes 1 to 13, the second element (in some embodiments, the third element or the fourth element) includes at least one selected from a group consisting of C, N, O, and B. The second element (in some embodiments, the third element or the fourth element) may include at least one selected from a group consisting of a semiconductor element and a metal element. For example, the second element (in some embodiments, the third element or the fourth element) may include at least one selected from a group consisting of C, N, O, B, Si, Ge, Ti, Zr, Hf, Nb, Ta, Mo, W, and Al. In some embodiments, the first element, the second element, the third element, and the fourth element are different elements.

(Supplementary Note 15)

In the method according to any one of Supplementary Notes 1 to 14, the insulating film includes at least one selected from a group consisting of an oxide-based insulating film and a nitride-based insulating film. For example, the insulating film includes at least one selected from a group consisting of an oxide film, a nitride film, an oxynitride film, an oxycarbonitride film, an oxycarbide film, and a carbonitride film.

(Supplementary Note 16)

In the method according to any one of Supplementary Notes 1 to 15, a thickness of the film is greater than or equal to 1 nm (10 Å) and smaller than or equal to 10 nm (100 Å), in some embodiments, greater than or equal to 2 nm (20 Å) and smaller than or equal to 5 nm (50 Å) and, in some embodiments, greater than or equal to 2 nm (20 Å) and smaller than or equal to 3 nm (30 Å).

(Supplementary Note 17)

According to another aspect of the present disclosure, there is provided a substrate processing apparatus including a process chamber configured to accommodate a substrate; a first supply system configured to supply a precursor containing a first element and a halogen element to the substrate in the process chamber; a second supply system configured to supply a reactant containing a second element to the substrate in the process chamber; and a control unit configured to control the first supply system and the second supply system to perform a process including pre-treating a surface of an insulating film formed on the substrate in the process chamber by supplying the precursor to the substrate; and forming a film containing the first element and the second element on the pre-treated surface of the insulating film by performing a cycle a predetermined number of times, the cycle including supplying the precursor to the substrate in the processor chamber; and supplying the reactant to the substrate in the process chamber, wherein the act of supplying the precursor and the act of supplying the reactant are performed non-simultaneously.

(Supplementary Note 18)

According to still another aspect of the present disclosure, there is provided a non-transitory computer-readable recording medium storing a program that causes a computer to perform processes of pre-treating a surface of an insulating film formed on a substrate by supplying a precursor containing a first element and a halogen element to the substrate; and forming a film containing the first element and a second element on the pre-treated surface of the insulating film by performing a cycle a predetermined number of times, the cycle including supplying the precursor to the substrate; and supplying a reactant containing the second element to the substrate, wherein the act of supplying the precursor and the act of supplying the reactant are performed non-simultaneously.

According to the present disclosure in some embodiments, it is possible to prevent occurrence of incubation period and formation of a transition layer when a film forming procedure is performed on an insulating film.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    pre-treating a surface of an insulating film formed on a substrate by supplying a precursor containing a first element and a halogen element to the substrate for a first time; purging the chamber after pre-treating the surface of the insulating film; and
    forming a film containing the first element and a second element on the pre-treated surface of the insulating film by performing a cycle a predetermined number of times, the cycle including:
        supplying the precursor to the substrate by re-introducing the precursor gas to the purged chamber for a second time less than the first time; and
        supplying a reactant containing the second element to the substrate, wherein the act of supplying the precursor and the act of supplying the reactant are performed non-simultaneously, and
    wherein the precursor is nitrogen-free.

2. The method of claim 1, wherein a supply condition of the precursor in the act of pre-treating the surface of the insulating film is different from a supply condition of the precursor per performance of the cycle in the act of forming the film.

3. The method of claim 1, wherein a supply time period of the precursor in the act of pre-treating the surface of the insulating film is set to be longer than a supply time period of the precursor per performance of the cycle in the act of forming the film.

4. The method of claim 1, wherein a supply flow rate of the precursor in the act of pre-treating the surface of the insulating film is set to be greater than a supply flow rate of the precursor in the act of forming the film.

5. The method of claim 1, wherein a pressure of a space where the substrate exists when the precursor is supplied in the act of pre-treating the surface of the insulating film is set to be greater than a pressure of a space where the substrate exists when the precursor is supplied in the act of forming the film.

6. The method of claim 1, wherein the act of pre-treating the surface of the insulating film includes forming a seed layer on the surface of the insulating film.

7. The method of claim 1, wherein the act of pre-treating the surface of the insulating film includes forming a seed layer containing the halogen element on the surface of the insulating film.

8. The method of claim 1, wherein the act of pre-treating the surface of the insulating film includes forming a seed layer containing the first element and the halogen element on the surface of the insulating film.

9. The method of claim 6, wherein a thickness of the seed layer is greater than or equal to 0.05 nm and smaller than or equal to 0.2 nm.

10. The method of claim 1, wherein the cycle further includes supplying a reactant containing a third element to the substrate, and
    wherein a film containing the first element, the second element, and the third element is formed on the pre-treated surface of the insulating film by performing the cycle the predetermined number of times in the act of forming the film.

11. The method of claim 10, wherein the cycle further includes supplying a reactant containing a fourth element to the substrate, and
    wherein a film containing the first element, the second element, the third element, and the fourth element is formed on the pre-treated surface of the insulating film by performing the cycle the predetermined number of times in the act of forming the film.

12. The method of claim 1, wherein the first element includes at least one selected from a group consisting of a semiconductor element and a metal element, and the halogen element includes at least one selected from a group consisting of Cl and F.

13. The method of claim 1, wherein the second element includes at least one selected from a group consisting of C, N, O, and B.

14. The method of claim 1, wherein the insulating film includes at least one selected from a group consisting of an oxide-based insulating film and a nitride-based insulating film.

15. The method of claim 1, wherein a thickness of the film containing the first element and the second element is greater than or equal to 1 nm and smaller than or equal to 10 nm.

16. A substrate processing apparatus comprising:
    a process chamber configured to accommodate a substrate;
    a first supply system configured to supply a precursor containing a first element and a halogen element to the substrate in the process chamber;
    a second supply system configured to supply a reactant containing a second element to the substrate in the process chamber; and
    a control unit configured to control the first supply system and the second supply system to perform a process including:
        pre-treating a surface of an insulating film formed on the substrate in the process chamber by supplying the precursor to the substrate for a first time; purging the chamber after pre-treating the surface of the insulating film; and
        forming a film containing the first element and the second element on the pre-treated surface of the insulating film by performing a cycle a predetermined number of times, the cycle including:
            supplying the precursor to the substrate in the process chamber; and
            supplying the reactant to the substrate in the process chamber by re-introducing the precursor gas to the purged chamber for a second time less than the first time,
    wherein the act of supplying the precursor and the act of supplying the reactant are performed non-simultaneously, and
    wherein the precursor is nitrogen-free.

17. A non-transitory computer-readable recording medium storing a program that causes a computer to perform processes of:

pre-treating a surface of an insulating film formed on a substrate by supplying a precursor containing a first element and a halogen element to the substrate for a first time; purging the chamber after pre-treating the surface of the insulating film; and forming a film containing the first element and a second element on the pre-treated surface of the insulating film by performing a cycle a predetermined number of times, the cycle including:

supplying the precursor to the substrate; and supplying a reactant containing the second element to the substrate by re-introducing the precursor gas to the purged chamber for a second time less than the first time, wherein the act of supplying the precursor and the act of supplying the reactant are performed non-simultaneously, and wherein the precursor is nitrogen-free.

\* \* \* \* \*